(12) United States Patent
Wang et al.

(10) Patent No.: US 12,626,672 B2
(45) Date of Patent: May 12, 2026

(54) ARRAY SUBSTRATE, DISPLAY APPARATUS AND CONTROL METHOD THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiao Wang, Beijing (CN); Yan Yan, Beijing (CN); Yu Ma, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 19/028,485

(22) Filed: Jan. 17, 2025

(65) Prior Publication Data

US 2025/0166583 A1 May 22, 2025

Related U.S. Application Data

(63) Continuation of application No. 18/626,983, filed on Apr. 4, 2024, now Pat. No. 12,243,500, which is a (Continued)

(30) Foreign Application Priority Data

Mar. 11, 2020 (CN) .......................... 202010167374.8

(51) Int. Cl.
  *G09G 3/30* (2006.01)
  *G02F 1/1333* (2006.01)
  (Continued)

(52) U.S. Cl.
  CPC ..... *G09G 3/3696* (2013.01); *G02F 1/133308* (2013.01); *G02F 1/134345* (2021.01);
  (Continued)

(58) Field of Classification Search
  CPC ..................... G09G 2300/0426; G09G 3/3655
  See application file for complete search history.

(56) References Cited

U.S. PATENT DOCUMENTS

| | | | | |
|---|---|---|---|---|
| 2007/0023752 A1* | 2/2007 | Nakamura | ........ | G02F 1/136213 |
| | | | | 438/149 |
| 2009/0128536 A1* | 5/2009 | Seo | ...................... | G09G 3/3655 |
| | | | | 345/87 |

(Continued)

*Primary Examiner* — Sanghyuk Park
(74) *Attorney, Agent, or Firm* — Dority & Manning, P.A.

(57) ABSTRACT

An array substrate has a display area and a bonding region. The display area includes a distal region, a proximal region, and a middle region therebetween. The array substrate includes a base, a common electrode located in the display area, a connecting lead disposed outside the distal region, a conductive frame at least partially surrounding the display area, and at least one first common signal line, at least one second common signal line and at least one third common signal line. The first common signal line, the second common signal line and the third common signal line are respectively coupled to portions of the common electrode located in the distal region, the proximal region and the middle region. The first common signal line is coupled to the connecting lead. The connecting lead and the portion of the common electrode located in the distal region are coupled to the conductive frame.

19 Claims, 19 Drawing Sheets

Related U.S. Application Data continuation of application No. 18/191,628, filed on Mar. 28, 2023, now Pat. No. 11,984,094, which is a continuation of application No. 17/425,204, filed as application No. PCT/CN2020/140386 on Dec. 28, 2020, now Pat. No. 11,645,995.

(51) Int. Cl.

| | |
|---|---|
| *G02F 1/1343* | (2006.01) |
| *G02F 1/1362* | (2006.01) |
| *G09G 3/36* | (2006.01) |
| *H02M 7/537* | (2006.01) |
| *H03F 3/45* | (2006.01) |

(52) U.S. Cl.
CPC ...... *G02F 1/136286* (2013.01); *H02M 7/537* (2013.01); *H03F 3/45475* (2013.01); *G09G 2310/0243* (2013.01); *G09G 2310/0291* (2013.01); *G09G 2320/0252* (2013.01)

(56) References Cited

U.S. PATENT DOCUMENTS

| | | | |
|---|---|---|---|
| 2015/0062471 A1* | 3/2015 | Sung .................... | G02F 1/1362 349/33 |
| 2020/0176481 A1* | 6/2020 | Takeda ............. | G02F 1/136286 |

* cited by examiner

ARRAY SUBSTRATE, DISPLAY APPARATUS AND CONTROL METHOD THEREOF

CROSS-REFERENCE TO RELATED APPLICATIONS

This application is a continuation of U.S. patent application Ser. No. 18/626,983, filed on Apr. 4, 2024, which is a continuation of U.S. patent application Ser. No. 18/191,628, filed on Mar. 28, 2023, which is a continuation of U.S. patent application Ser. No. 17/425,204, filed on Jul. 22, 2021, which is a national phase entry under 35 USC 371 of International Patent Application No. PCT/CN2020/140386, filed on Dec. 28, 2020, which in turn claims priority to Chinese Patent Application No. 202010167374.8, filed on Mar. 11, 2020, which are incorporated herein by reference in their entirety.

TECHNICAL FIELD

The present disclosure relates to the field of display technologies, and in particular, to an array substrate, a display apparatus and a control method thereof.

BACKGROUND

In recent years, with the advancement of display technologies, users have higher and higher requirements for viewing experience. Liquid crystal display technology has been successfully applied to display products such as notebook computers, display screens, and televisions. With an increase in the possession of liquid crystal display products, people have also put forward higher requirements for display quality of liquid crystal display products.

SUMMARY

In an aspect, an array substrate is provided. The array substrate has a display area and a bonding region located at a side of the display area. The display area includes gate lines extending in a first direction and arranged in a second direction, the first direction intersects the second direction. The bonding region corresponds to a first region, and the first region extends in the first direction. The array substrate further has a second region, a third region and a fourth region. The second region extends in the first direction. The first region and the second region are opposite in the second direction, and the third region and the fourth region are opposite in the first direction. The display area is located between the first region and the second region and between the third region and the fourth region. The display area includes a distal region away from the bonding region and a proximal region proximate to the bonding region. The array substrate includes: a base, a common electrode disposed on the base and located in the display area, a connecting lead disposed in the second region, a conductive frame, and at least one first common signal line disposed on the base. The at least one first common signal line is disposed in the third region and/or the fourth region, and is coupled to the common electrode. The at least one first common signal line is coupled to the connecting lead. At least part of the conductive frame is located in the second region. The connecting lead and the common electrode are coupled to the conductive frame, so that the at least one first common signal line is coupled to the common electrode through the connecting lead and the conductive frame. The connecting lead includes at least two first connecting lines, and the at least two first connecting lines are coupled to the conductive frame. The display area further includes a pixel electrode and a thin film transistor, and the pixel electrode is couple to the thin film transistor.

In some embodiments, the conductive frame is further located in the third region. The array substrate further includes a plurality of second connecting lines located on a side of the common electrode proximate to the third region, and the conductive frame is coupled to the common electrode through the plurality of second connecting lines.

In some embodiments, the conductive frame is further located in the fourth region. The array substrate further includes a plurality of third connecting lines located on a side of the common electrode proximate to the fourth region, and the conductive frame is coupled to the common electrode through the plurality of third connecting lines.

In some embodiments, the plurality of second connecting lines and the plurality of third connecting lines are disposed symmetrically about a midline of the display area in the second direction.

In some embodiments, the array substrate further includes at least one second common signal line disposed on the base. The at least one second common signal line is disposed in the third region and/or the fourth region; and the at least one second common signal line is coupled to the common electrode.

In some embodiments, the array substrate further includes at least one third common signal line disposed on the base. The at least one third common signal line is disposed in the third region and/or the fourth region, and a third common signal line is disposed between a first common signal line and the display area. The display area further includes a middle region located between the distal region and the proximal region. The at least one first common signal line is coupled to a portion of the common electrode located in the distal region and extending to the bonding region. The at least one second common signal line is coupled to a portion of the common electrode located in the proximal region and extending to the bonding region. The at least one third common signal line is coupled to a portion of the common electrode located in the middle region and extending to the bonding region.

In some embodiments, the connecting lead and the portion of the common electrode located in the distal region are coupled to the conductive frame, so that the at least one first common signal line is coupled to the portion of the common electrode located in the distal region through the connecting lead and the conductive frame.

In some embodiments, the array substrate further includes at least one feedback signal line disposed on the base. The at least one feedback signal line is coupled to the portion of the common electrode located in the distal region and extends to the bonding region. A feedback signal line is disposed between the first common signal line and the third common signal line. The feedback signal line in the at least one feedback signal line is configured to transmit a common voltage signal of the portion of the common electrode located in the distal region.

In some embodiments, the at least one feedback signal line includes two feedback signal lines, and the two feedback signal lines are disposed in the third region and the fourth region, respectively.

In some embodiments, the at least one first common signal line includes two first common signal lines, and the two first common signal lines are disposed in the third region and the fourth region, respectively.

In some embodiments, the at least one second common signal line includes two second common signal lines, and the two second common signal lines are disposed at two opposite ends of a side of the proximal region proximate to the bonding region.

In some embodiments, the at least one third common signal line includes two third common signal lines, and the two third common signal lines are disposed on two opposite sides of the display area.

In some embodiments, the at least one feedback signal line and the at least one first common signal line are made of a same material and disposed in a same layer.

In some embodiments, the at least one feedback signal line is coupled to the conductive frame, so that the at least one feedback signal line is coupled to the portion of the common electrode located in the distal region through the conductive frame.

In some embodiments, the at least one first common signal line, the connecting lead and the conductive frame are made of a same material and disposed in a same layer.

In some embodiments, a resistance of the first common signal line, a resistance of the second common signal line, and a resistance of the third common signal line are all less than or equal to 300Ω; and a resistance of the feedback signal line is less than or equal to 1000Ω.

In some embodiments, the array substrate further includes data lines disposed on the base. The data lines are arranged closer to the base than the common electrode in a direction perpendicular to the base, and orthogonal projections of the data lines on the base at least partially overlap with an orthogonal projection of the common electrode on the base.

In some embodiments, the array substrate has a plurality of sub-pixel regions. The common electrode includes a plurality of sub-electrodes and a plurality of first conductive patterns. A sub-electrode is located in at least one sub-pixel region, and adjacent sub-electrodes are coupled through at least one first conductive pattern.

In another aspect, a display apparatus is provided. The display apparatus includes the array substrate as described in any of the above embodiments and a circuit board. The circuit board is bonded to the bonding region in the array substrate. The circuit board includes a control circuit, and the control circuit is coupled to the first common signal line in the array substrate. The control circuit is configured to, according to a common voltage signal of the portion of the common electrode located in the distal region, generate a first compensation common voltage signal and transmit the first compensation common voltage signal to the first common signal line.

In some embodiments, the array substrate further includes at least one feedback signal line disposed on the base. The at least one feedback signal line is coupled to the portion of the common electrode located in the distal region, and the at least one feedback signal line extends to the bonding region and is configured to be coupled to the circuit board. A feedback signal line in the at least one feedback signal line is configured to transmit the common voltage signal of the portion of the common electrode located in the distal region to the circuit board.

In some embodiments, the array substrate further includes at least one second common signal line and at least one third common signal line that are disposed on the base. The at least one second common signal line is disposed in the third region and/or the fourth region, and the at least one second common signal line is coupled to a portion of the common electrode located in the proximal region. The at least one third common signal line is disposed in the third region and/or the fourth region, and the at least one third common signal line is coupled to a portion of the common electrode located in a middle region between the distal region and the proximal region. The control circuit is further configured to, according to the common voltage signal, generate a second compensation common voltage signal and transmit the second compensation common voltage signal to the second common signal line, and generate a third compensation common voltage signal and transmit the third compensation common voltage signal to the third common signal line.

In some embodiments, the control circuit includes an inverter and a first operational amplifier. The inverter is coupled to the at least one feedback signal line, and the inverter is configured to invert the common voltage signal transmitted by the feedback signal line. The first operational amplifier is coupled to the inverter and the first common signal line, and the first operational amplifier is configured to amplify an inverted signal from the inverter to generate the first compensation common voltage signal, and transmit the first compensation common voltage signal to the first common signal line.

In some embodiments, the control circuit further includes a second operational amplifier. The second operational amplifier is coupled to the inverter and the second common signal line. The second operational amplifier is configured to amplify the inverted signal from the inverter to generate the second compensation common voltage signal, and transmit the second compensation common voltage signal to the second common signal line. An amplification factor of the second operational amplifier is less than an amplification factor of the first operational amplifier.

In some embodiments, the control circuit further includes a third operational amplifier. The third operational amplifier is coupled to the inverter and the third common signal line. The third operational amplifier is configured to amplify the inverted signal from the inverter to generate the third compensation common voltage signal, and transmit the third compensation common voltage signal to the third common signal line. An amplification factor of the third operational amplifier is less than the amplification factor of the first operational amplifier.

In some embodiments, the control circuit further includes a third operational amplifier coupled to the inverter and the third common signal line. The third operational amplifier is configured to amplify the inverted signal from the inverter to generate the third compensation common voltage signal, and transmit the third compensation common voltage signal to the third common signal line. An amplification factor of the third operational amplifier is less than the amplification factor of the first operational amplifier, and the amplification factor of the third operational amplifier is greater than the amplification factor of the second operational amplifier.

In yet another aspect, a control method of the display apparatus as described in any of the above embodiments is provided, including: obtaining, by the control circuit in the circuit board, the common voltage signal of the portion of the common electrode located in the distal region; generating, by the control circuit, the first compensation common voltage signal according to the common voltage signal, and transmitting, by the control circuit, the first compensation common voltage signal to the first common signal line, so as to compensate for the common voltage signal of the portion of the common electrode located in the distal region; generating, by the control circuit, the second compensation common voltage signal according to the common voltage signal, and transmitting, by the control circuit, the second compensation common voltage signal to the second common signal line, so as to compensate for a common voltage signal of the portion of the common electrode located in the proximal region; and generating, by the control circuit, the third compensation common voltage signal according to the common voltage signal, and transmitting, by the control circuit, the third compensation common voltage signal to the third common signal line, so as to compensate for a common voltage signal of the portion of the common electrode located in the middle region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
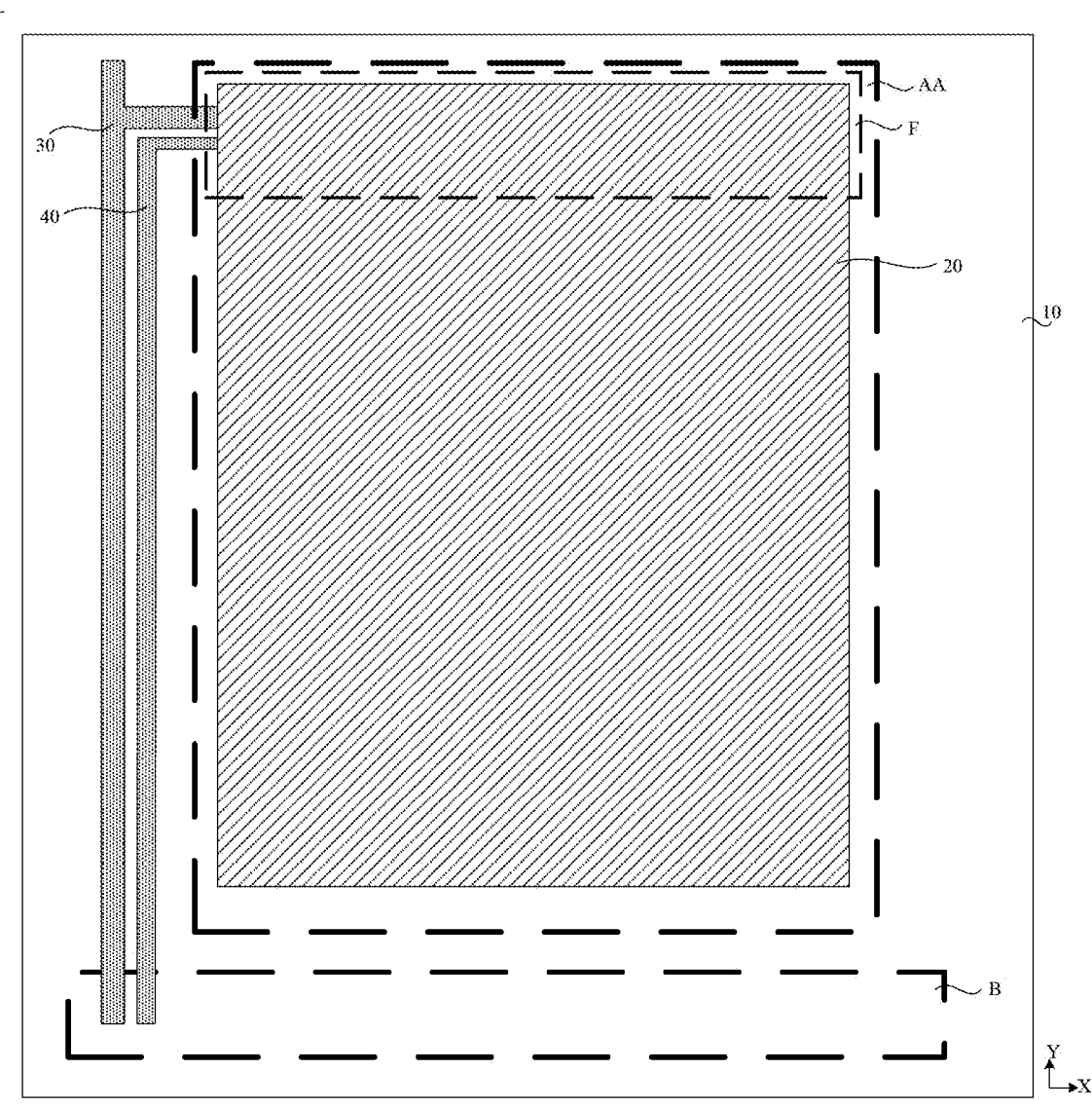
FIG. 1 is a top view of an array substrate, in accordance with some embodiments.

Technical solutions in some embodiments of the present disclosure will be described clearly and completely below with reference to accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are used for descriptive purposes only, and are not to be construed as indicating or implying relative importance or implicitly indicating the number of indicated technical features. Thus, features defined with "first" and "second" may explicitly or implicitly include one or more of the features. In the description of the embodiments of the present disclosure, "a plurality of", "the plurality of" or "multiple" means two or more unless otherwise specified.

In the description of some embodiments, the expressions "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In the related art, for a display apparatus with a large size and a narrow bezel, such as a high aperture advanced super dimensional switching (HADS) display apparatus, the bezel thereof is relatively narrow (e.g., a width of the bezel is 3.5 mm), so that a width of a signal line is small, a resistance of the signal line increases, and a recovery capability of the signal line decreases. In addition, high resolution of the display apparatus (e.g., the resolution is (2560×1440)) and a large coupling capacitance (e.g., a coupling capacitance formed between a data line and a common electrode) in the display apparatus may result in signal distortion in a signal transmission process and potential drift, which affects normal charging and discharging of pixels, so that line image sticking may appear and are difficult to eliminate in a display period of the display apparatus. An image sticking is an image retention, in which a static picture remains on a screen for a long time. This phenomenon will change with a passage of time and a change of the picture, and finally disappear. For example, there may be accumulation of charges in a pixel electrode of the display apparatus due to the coupling capacitance and other reasons. In a case where the charges accumulate to a certain extent, a potential difference and an electric field may be formed between the pixel electrode and a common electrode, which causes liquid crystals to continue to deflect. The charges will appear as image sticking in a process of slowly disappearing, thereby affecting a display effect.

Figure 10:
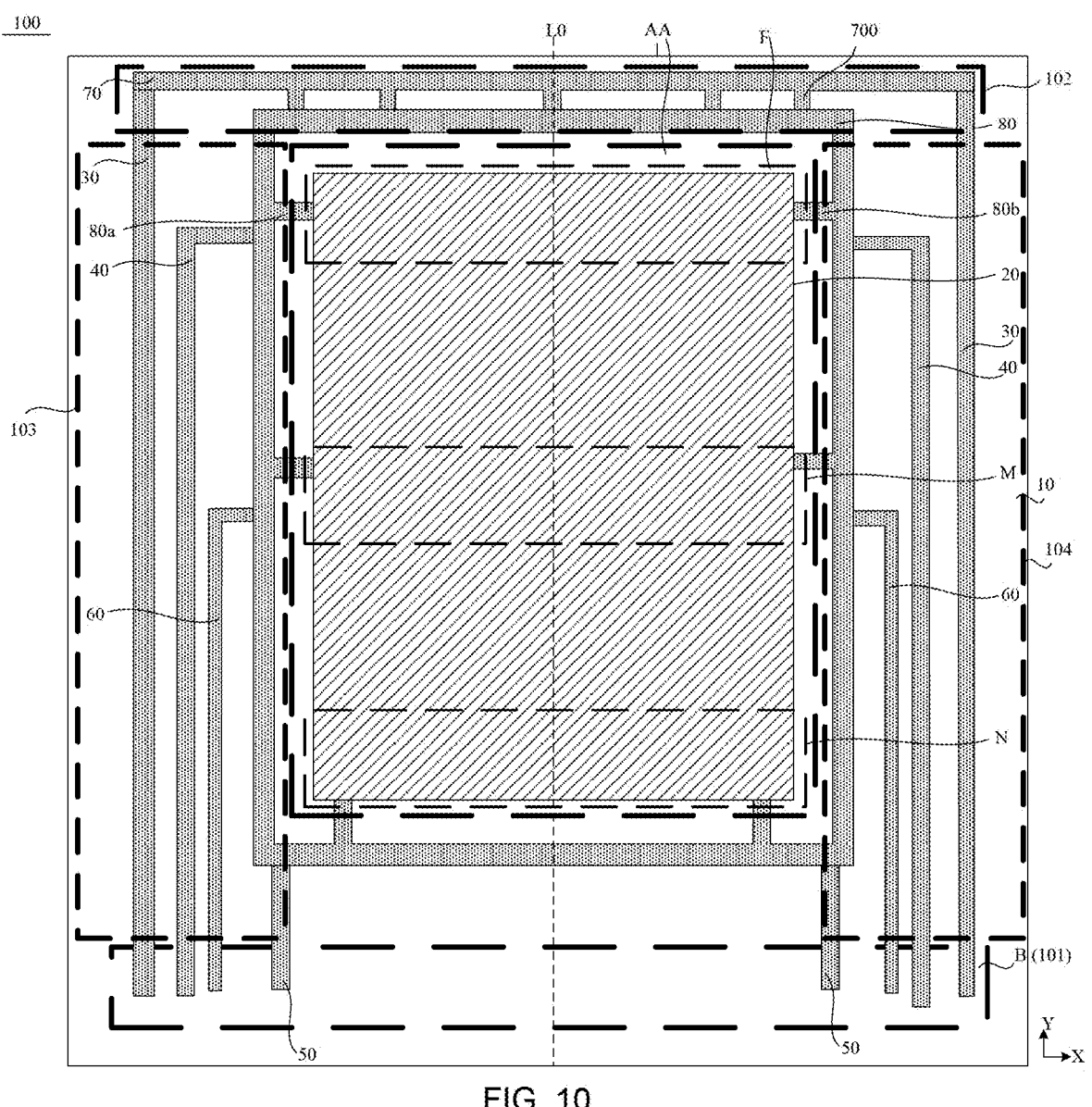
FIG. 10 is a top view of yet another array substrate, in accordance with some embodiments.

The embodiments of the present disclosure provide an array substrate 100. As shown in FIG. 1, the array substrate 100 has a display area (also referred to as an active area) AA and a bonding region B (the bonding region B corresponding to a first region 101 of the array substrate 100 in FIG. 10, which can be understood as that the bonding region B is located in the first region 101, or the bonding region B is the first region 101) located at a side of the display area. Referring to FIG. 10, the array substrate 100 further has a second region 102, a third region 103 and a fourth region 104. The first region 101 and the second region 102 both extend in the first direction X. The first region 101 and the second region 102 are opposite in the second direction Y, and the third region 103 and the fourth region 104 are opposite in the first direction X. The display area AA is located between the first region 101 and the second region 102 and between the third region 103 and the fourth region 104. The display area includes a distal region F away from the bonding region B.

The array substrate 100 includes a base 10, a common electrode 20, a first common signal line 30, and a feedback signal line 40.

The common electrode 20 is disposed on the base 10 and located in the display area.

For example, a material of the common electrode 20 may be a transparent conductive material including indium tin oxide (ITO).

The first common signal line 30 and the feedback signal line 40 are disposed on the base 10. The first common signal line 30 is disposed in the third region 103 or the fourth region 104.

The first common signal line 30 and the feedback signal line 40 are coupled to a portion of the common electrode 20 located in the distal region F. The first common signal line 30 and the feedback signal line 40 extend to the bonding region B to be coupled to a circuit board.

The feedback signal line 40 is configured to transmit a common voltage signal of the portion of the common electrode 20 located in the distal region F to the circuit board.

The first common signal line 30 is configured to transmit a first compensation common voltage signal to the portion of the common electrode 20 located in the distal region F.

The first compensation common voltage signal is a signal obtained by the circuit board compensating for the common voltage signal according to the common voltage signal.

For example, an area of the distal region F accounts for ⅛ to ⅕ of an area of the display area, e.g., the area of the distal region F accounts for ⅙ of the area of the display area.

In this case, the feedback signal line 40 transmits the common voltage signal of the portion of the common electrode 20 located in the distal region F to the circuit board; the circuit board obtains the first compensation common voltage signal according to the common voltage signal; and transmits the first compensation common voltage signal to the portion of the common electrode 20 located in the distal region F through the first common signal line 30, so as to compensate for the common voltage signal of the portion of the common electrode 20 located in the distal region F, which may avoid delay in the common voltage signal of the portion of the common electrode 20 located in the distal region F, thereby improving the display effect.

Therefore, the array substrate 100 provided by the embodiments of the present disclosure includes the first common signal line 30 and the feedback signal line 40, and the first common signal line 30 and the feedback signal line 40 are coupled to the portion of the common electrode 20 located in the distal region F. The feedback signal line 40 transmits the common voltage signal of the portion of the common electrode 20 located in the distal region F to the circuit board, so as to generate the first compensation common voltage signal. The first common signal line 30 transmits the first compensation common voltage signal to the portion of the common electrode 20 located in the distal region F, so as to compensate for the common voltage signal of the portion of the common electrode 20 located in the distal region F. As a result, the delay in the common voltage signal of the portion of the common electrode 20 located in the distal region F may be avoided, and the image sticking appearing during display caused by the potential drift of the common voltage signal may also be avoided, thereby improving the display effect.

Figure 2:
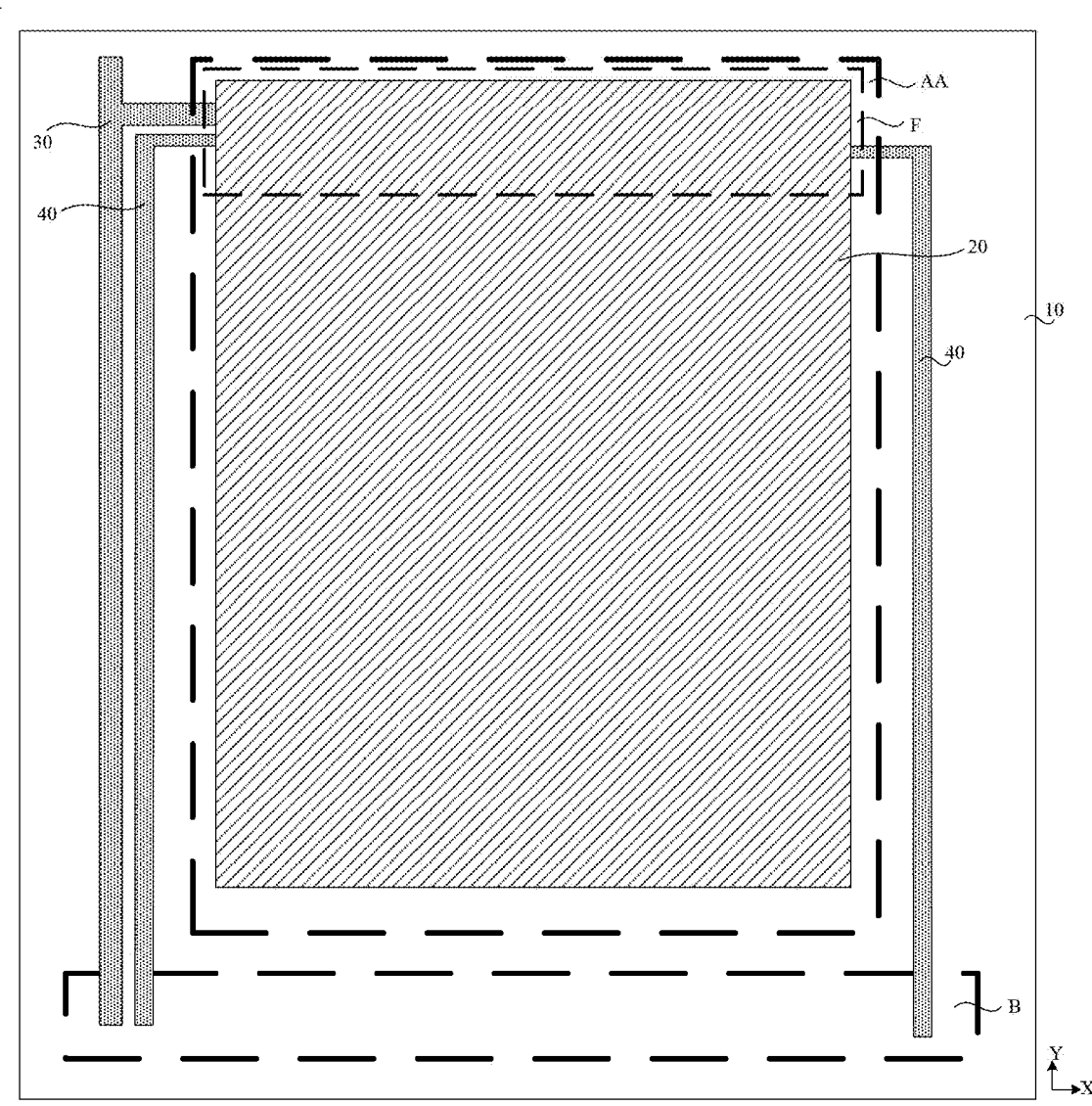
FIG. 2 is a top view of another array substrate, in accordance with some embodiments.

In some embodiments, as shown in FIG. 2, the array substrate 100 includes two feedback signal lines 40, and the two feedback signal lines 40 are disposed on two opposite sides of the display area. That is, the first common signal lines 30 are disposed in the third region 103 and the fourth region 104.

In this case, in a process where the feedback signal line 40 transmits the common voltage signal of the portion of the common electrode 20 located in the distal region F to the circuit board, transmission time of the common voltage signal may be shortened, and the common voltage signal may be quickly transmitted to the circuit board, so that an efficiency of compensating for the common voltage signal may be improved.

Figure 3:
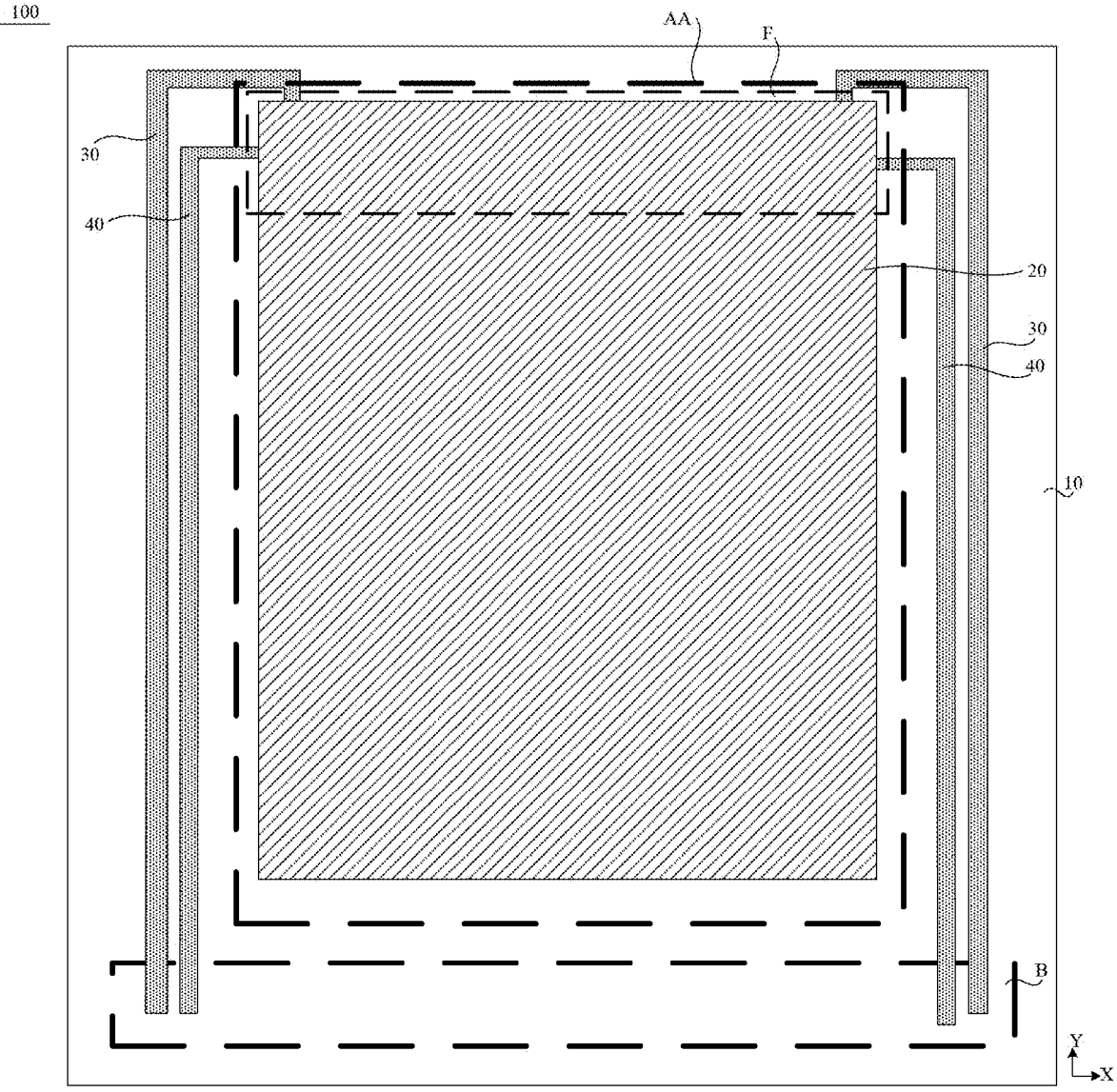
FIG. 3 is a top view of yet another array substrate, in accordance with some embodiments.

In some embodiments, as shown in FIG. 3, the array substrate 100 includes two first common signal lines 30, and the two first common signal lines 30 are disposed on the two opposite sides of the display area. Positions where the first common signal lines 30 are coupled to the common electrode 20 are located on a side of the common electrode 20 away from the bonding region B.

The positions where the first common signal lines 30 are coupled to the common electrode 20 are the positions, in the portion of the common electrode 20 located in the distal region F, that are farthest away from the bonding region B.

Since there is a large gap between the portion of the common electrode 20 located in the distal region F and the circuit board, signals are greatly affected by the coupling capacitance in the array substrate 100 in a process where the circuit board transmits the signals to the portion of the common electrode 20 located in the distal region F. Therefore, the first common signal line 30 transmits the first compensation common voltage signal to a side of the portion of the common electrode 20 located in the distal region F away from the bonding region B, so as to compensate for the common voltage signal of the portion of the common electrode 20 located in the distal region F. As a result, it may be possible to improve a problem of serious delay in the common voltage signal of the portion of the common electrode 20 located in the distal region F, and avoid a distortion of the common voltage signal. In addition, the two first common signal lines 30 may shorten time for compensating for the common voltage signal of the portion of the common electrode 20 located in the distal region F, and improve the efficiency of compensating for the common voltage signal of the common electrode 20.

Figure 4:
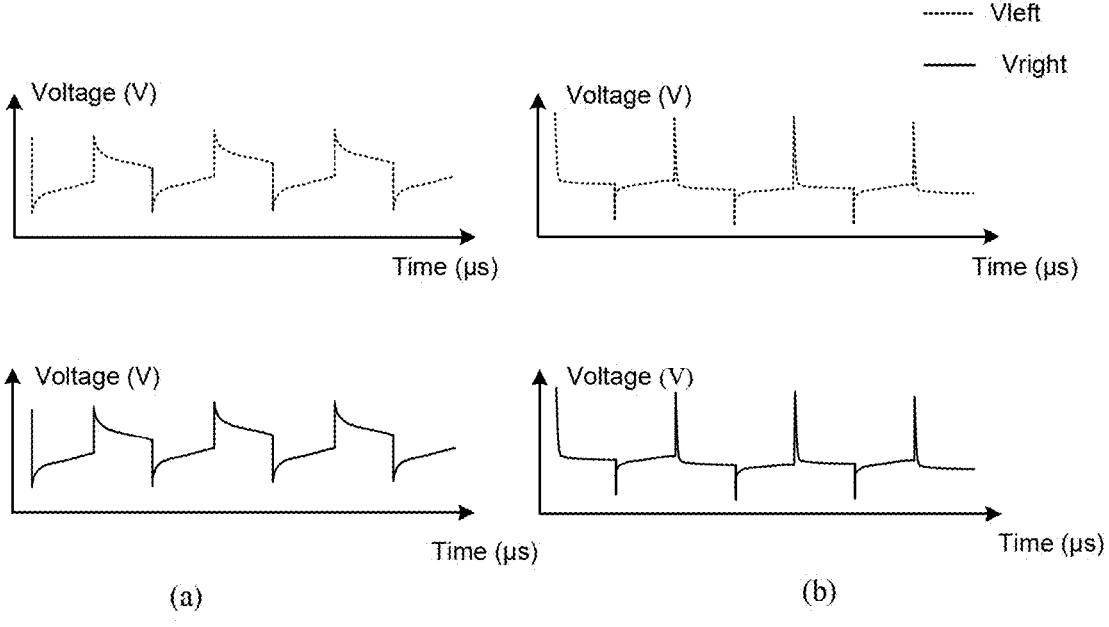
FIG. 4 illustrates comparison waveform diagrams of a common voltage signal in an array substrate, in accordance with some embodiments.

For example, part (a) in FIG. 4 is waveform diagrams before the common voltage signal in the array substrate 100 is compensated, and part (b) in FIG. 4 is waveform diagrams after the common voltage signal in the array substrate 100 is compensated, wherein a horizontal axis represents time (μs), and a vertical axis represents a voltage (V) of the common voltage signal. According to a common voltage signal Vleft on one of the two first common signal lines 30 located on one of the two opposite sides of the display area (e.g., a left side of the array substrate 100 in FIG. 3), and a common voltage signal Vright on another of the two first common signal lines 30 located on another of the two opposite sides of the display area (e.g., a right side of the array substrate 100 in FIG. 3), it may be seen that a signal delay degree of the waveforms of the common voltage signals in part (a) in FIG. 4 is relatively large, and a potential drift degree of the waveforms of the common voltage signals in part (b) in FIG. 4 is obviously weakened compared with a potential drift degree of the waveforms of the common voltage signals in part (a) in FIG. 4, which may avoid the distortion of the common voltage signal and improve a recovery capability of the first common signal line 30.

Figure 5:
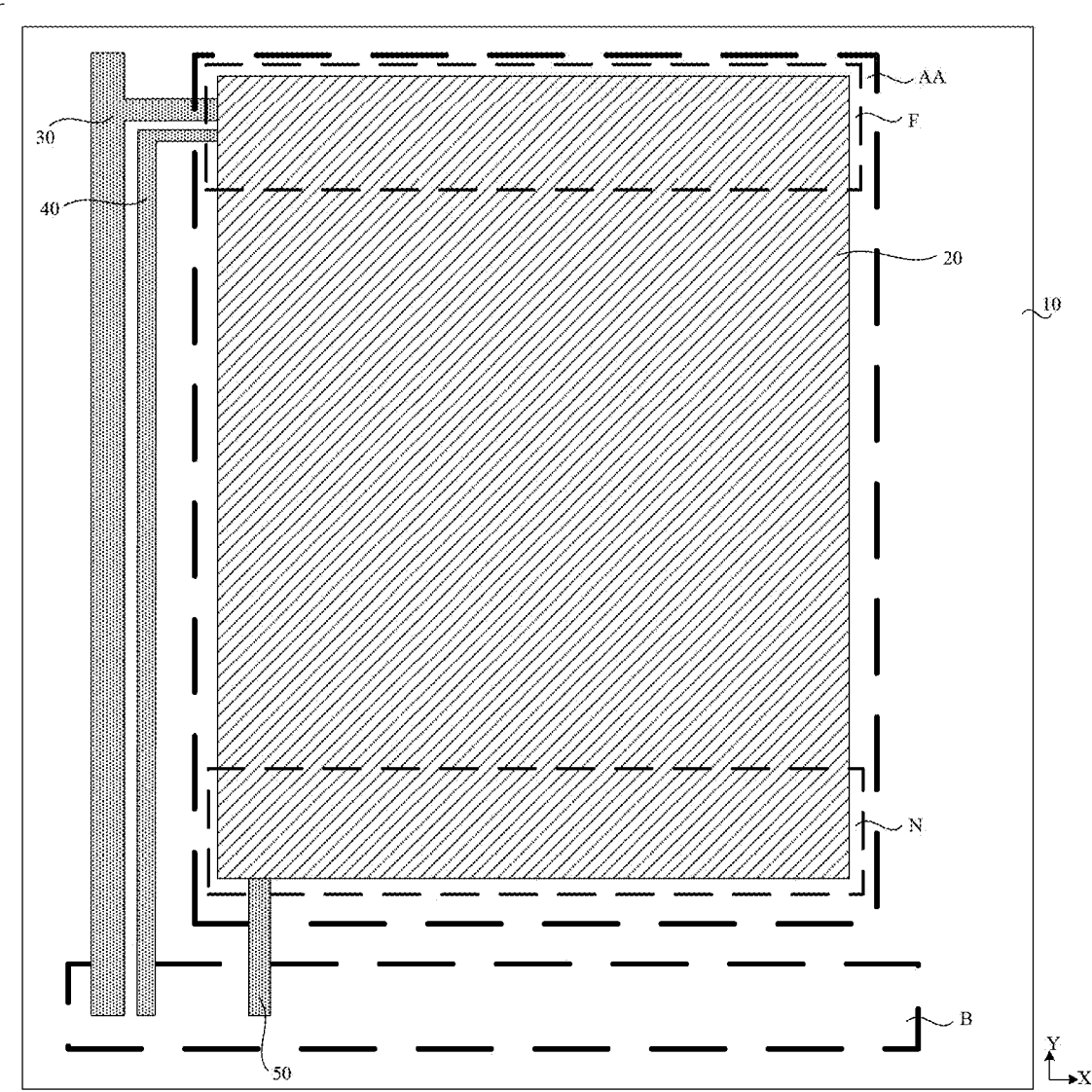
FIG. 5 is a top view of an array substrate, in accordance with some embodiments.

In some embodiments, as shown in FIG. 5, the display area further includes a proximal region N proximate to the bonding region B. The array substrate 100 further includes a second common signal line 50. The second common signal line 50 is coupled to a portion of the common electrode 20 located in the proximal region N, and the second common signal line 50 extends to the bonding region B to be coupled to the circuit board. The second common signal line 50 is disposed in the third region 103 or the fourth region 104.

The second common signal line 50 is configured to transmit the common voltage signal or a second compensation common voltage signal to the portion of the common electrode 20 located in the proximal region N.

For example, an area of the proximal region N accounts for ⅛ to ⅓ of the area of the display area, e.g., the area of the proximal region N accounts for ⅙ of the area of the display area.

In this case, the feedback signal line 40 transmits the common voltage signal of the portion of the common electrode 20 located in the distal region F to the circuit board; the circuit board obtains the second compensation common voltage signal according to the common voltage signal; and transmits the second compensation common voltage signal to the portion of the common electrode 20 located in the proximal region N through the second common signal line 50, so as to compensate for a common voltage signal of the portion of the common electrode 20 located in the proximal region N, which may avoid delay in the common voltage signal of the portion of the common electrode 20 located in the proximal region N, thereby improving the display effect.

Figure 6:
FIG. 6 is a top view of yet another array substrate, in accordance with some embodiments.

In some embodiments, as shown in FIG. 6, the array substrate 100 includes two second common signal lines 50, and the two second common signal lines 50 are disposed at two opposite ends of a side of the proximal region N proximate to the bonding region B. That is, the second common signal lines 50 are disposed in the third region 103 and the fourth region 104.

In this case, in a process where the second common signal line 50 transmits the second compensation common voltage signal to the portion of the common electrode 20 located in the proximal region N, the two second common signal lines 50 may shorten the transmission time of the second compensation common voltage signal, so that the common voltage signal of the portion of the common electrode 20 located in the proximal region N may be compensated quickly, thereby improving the efficiency of compensating for the common voltage signal of the common electrode 20.

Figure 7:
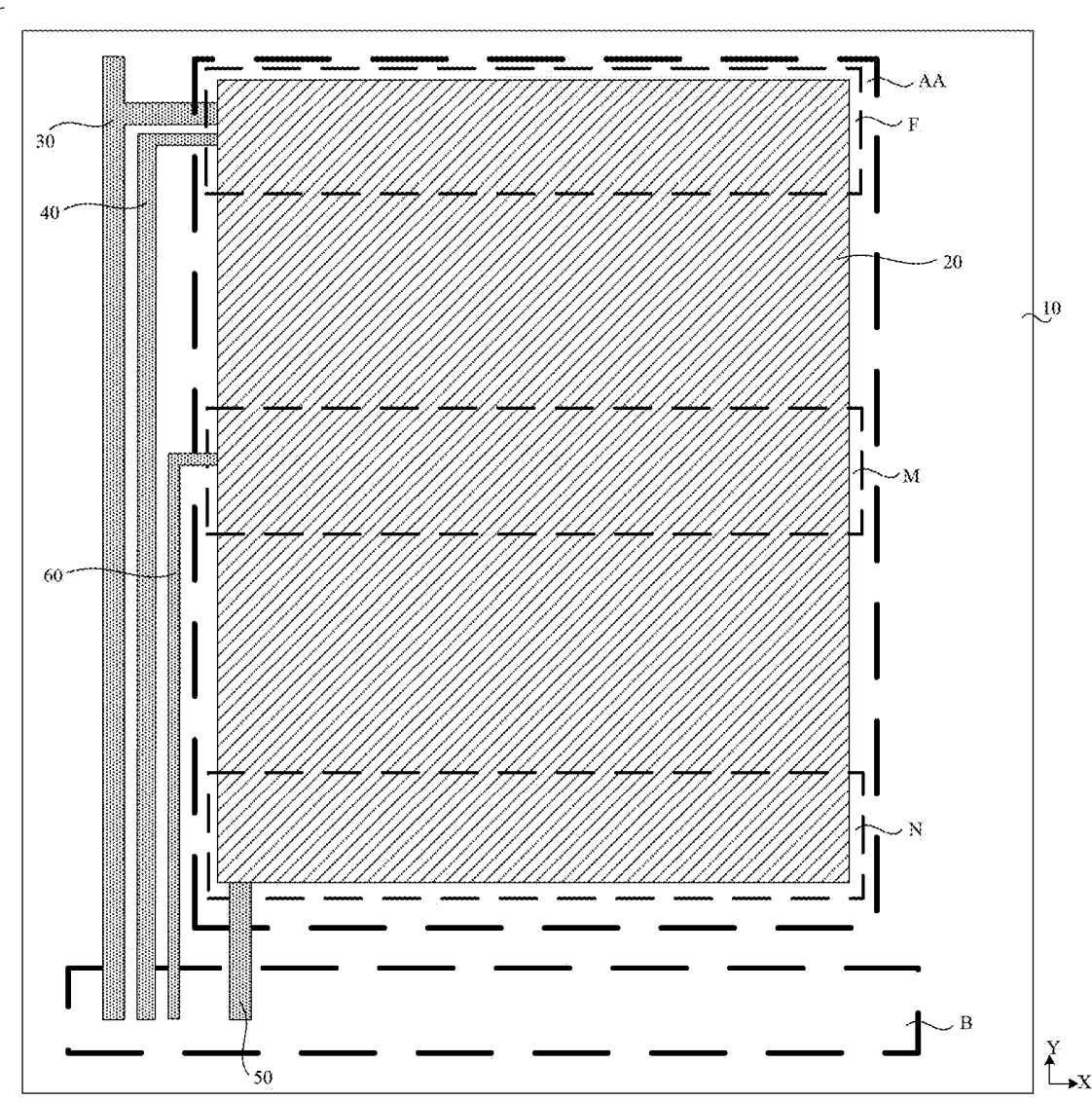
FIG. 7 is a top view of yet another array substrate, in accordance with some embodiments.

In some embodiments, as shown in FIG. 7, the display area further includes a middle region M located between the distal region F and the proximal region N. The array substrate 100 further includes a third common signal line 60 disposed on the base 10. The third common signal line 60 is disposed in the third region 103 or the fourth region 104.

The third common signal line 60 extends to the bonding region B to be coupled to the circuit board. The third common signal line 60 is coupled to a portion of the common electrode 20 located in the middle region M.

The third common signal line 60 is configured to transmit a third compensation common voltage signal to the portion of the common electrode 20 located in the middle region M.

For example, the third common signal line 60 may be disposed between the first common signal line 30 and the display area AA, and the feedback signal line 40 may be disposed between the first common signal line 30 and the third common signal line 60.

For example, an area of the middle region M accounts for ⅛ to ⅓ of the area of the display area, e.g., the area of the middle region M accounts for ⅙ of the area of the display area.

In this case, the feedback signal line 40 transmits the common voltage signal of the portion of the common electrode 20 located in the distal region F to the circuit board; the circuit board compensates for the common voltage signal according to the common voltage signal, so as to obtain the third compensation common voltage signal; and the third common signal line 60 transmits the third compensation common voltage signal to the portion of the common electrode 20 located in the middle region M, so as to compensate for a common voltage signal of the portion of the common electrode 20 located in the middle region M, which may avoid delay in the common voltage signal of the portion of the common electrode 20 located in the middle region M, thereby improving the display effect.

Figure 8:
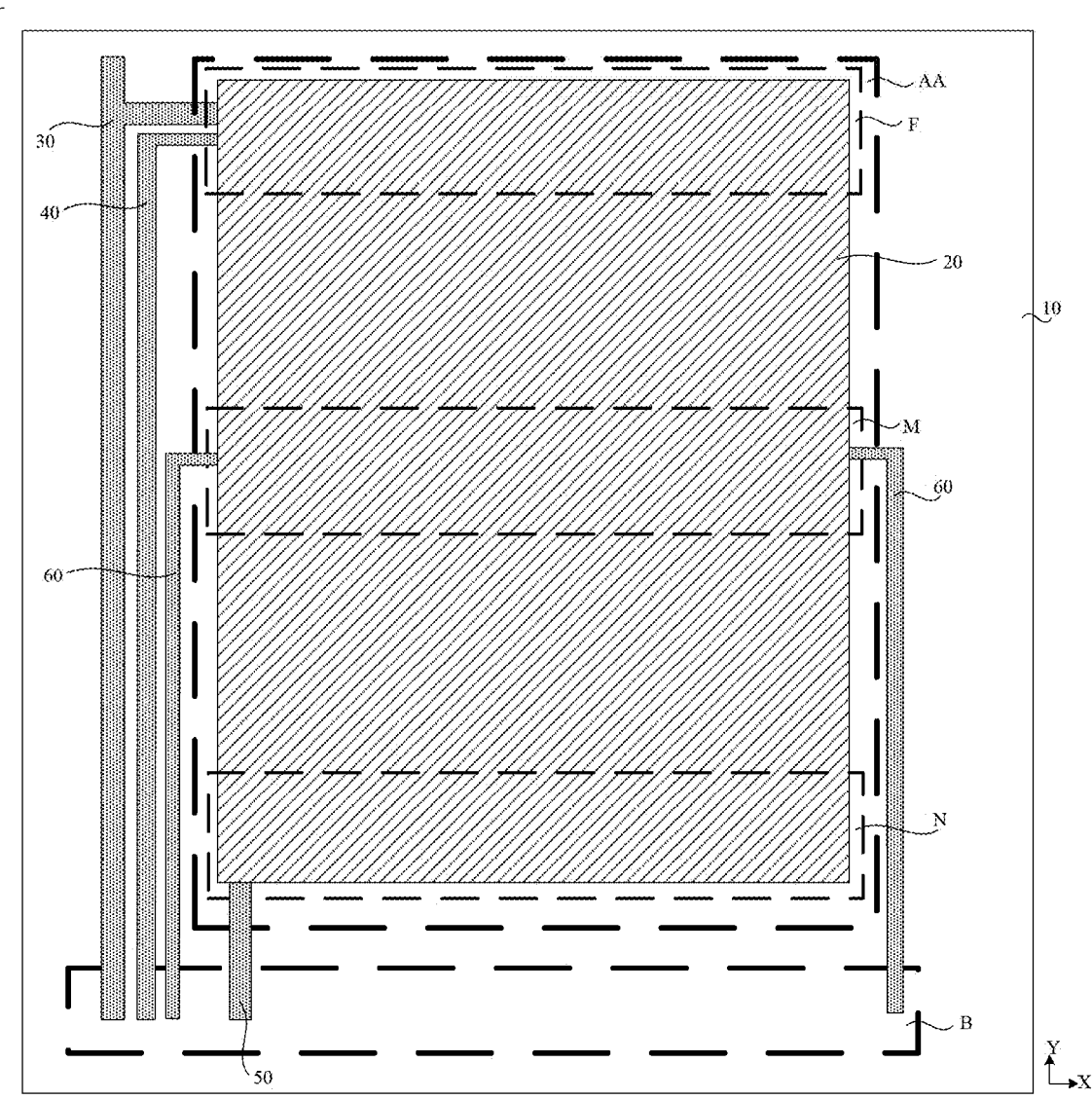
FIG. 8 is a top view of yet another array substrate, in accordance with some embodiments.

In some embodiments, as shown in FIG. 8, the array substrate 100 includes two third common signal lines 60, and the two third common signal lines 60 are disposed on the two opposite sides of the display area. That is, the third common signal lines 60 are disposed in the third region 103 and the fourth region 104.

In this case, in a process where the third common signal lines 60 transmit the third compensation common voltage signal to the portion of the common electrode 20 located in the middle region M, the two third common signal lines 60 may shorten the transmission time of the third compensation common voltage signal, so that the common voltage signal of the portion of the common electrode 20 located in the middle region M may be compensated quickly, thereby improving the efficiency of compensating for the common voltage signal of the common electrode 20.

Figure 9:
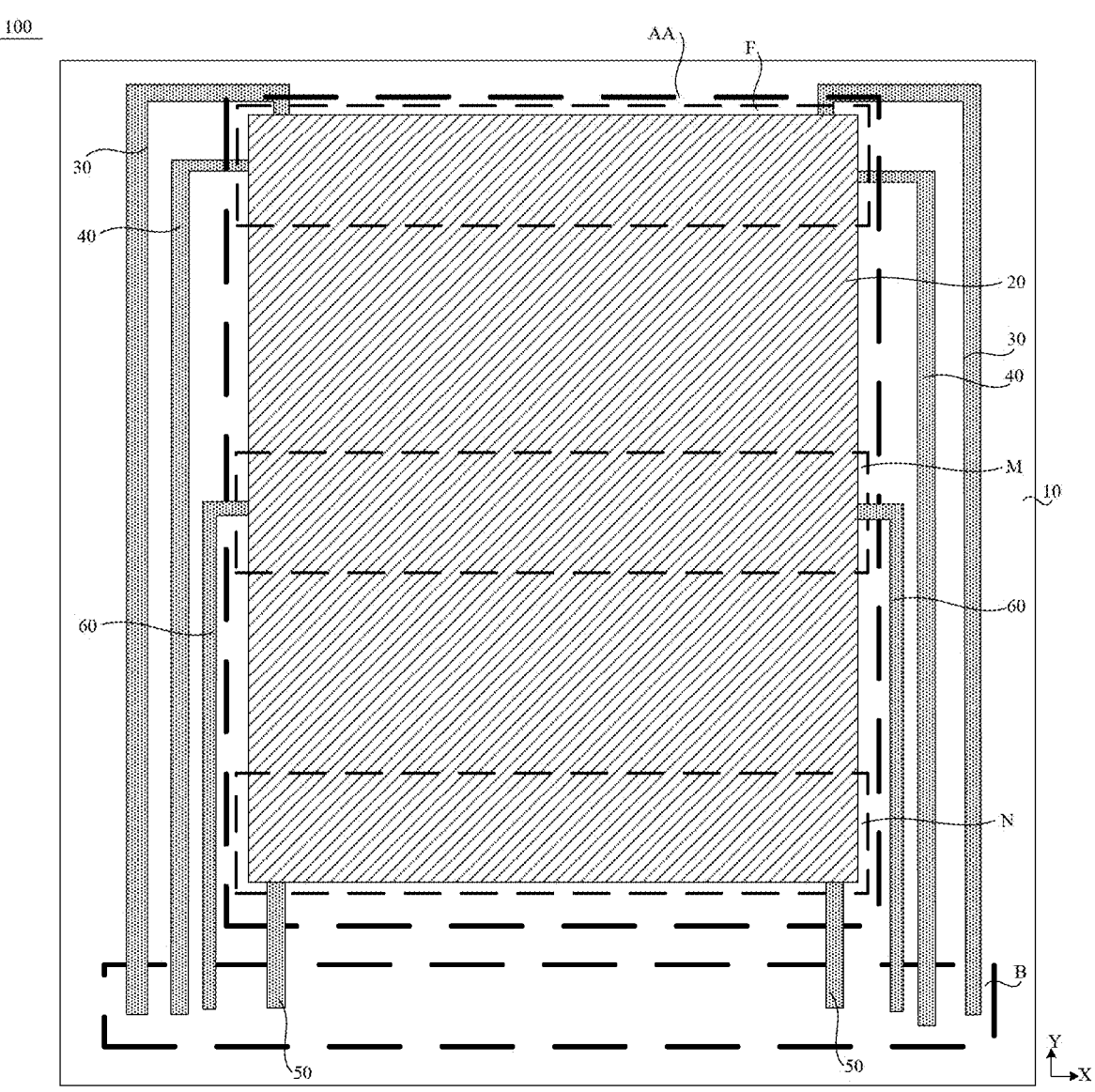
FIG. 9 is a top view of yet another array substrate, in accordance with some embodiments.

In some embodiments, as shown in FIG. 9, the array substrate 100 includes two first common signal lines 30, two second common signal lines 50, two third common signal lines 60, and two feedback signal lines 40, and beneficial effects are similar to the above, which will not be repeated here.

In some embodiments, the feedback signal line(s) 40 and the first common signal line(s) 30 are made of a same material and disposed in a same layer.

For example, the material of the feedback signal line(s) 40 and the first common signal line(s) 30 may include a metal material such as copper (Cu), aluminum (Al), molybdenum (Mo), titanium (Ti), chromium (Cr), and tungsten (W).

In this case, the feedback signal line(s) 40 and the first common signal line(s) 30 may be formed synchronously, so that production processes may be simplified in terms of process.

In some embodiments, in a case where the array substrate 100 includes the second common signal line(s) 50, the second common signal line(s) 50 and the first common signal line(s) 30 are made of a same material and disposed in a same layer.

In this case, the second common signal line(s) 50 and the first common signal line(s) 30 may be formed synchronously, so that the production processes may be simplified in terms of process.

In some embodiments, in a case where the array substrate 100 includes the third common signal line(s) 60, the third common signal line(s) 60 and the first common signal line(s) 30 are made of a same material and disposed in a same layer.

In this case, the third common signal line(s) 60 and the first common signal line(s) 30 may be formed synchronously, so that the production processes may be simplified in terms of process.

In some embodiments, as shown in FIG. 10, the array substrate 100 further includes a connecting lead 70 and a conductive frame 80.

The connecting lead 70 is disposed outside the distal region F of the display area (corresponding to the second region 102 of the array substrate 100 in FIG. 10), and the first common signal line(s) 30 are coupled to the connecting lead 70.

The conductive frame 80 surrounds the display area, the feedback signal line(s) 40, the connecting lead 70 and the portion of the common electrode 20 located in the distal region F are coupled to the conductive frame 80, so that the first common signal line(s) 30 are coupled to the portion of the common electrode 20 located in the distal region F through the connecting lead 70 and the conductive frame 80, and the feedback signal line(s) 40 are coupled to the portion of the common electrode 20 located in the distal region F through the conductive frame 80.

In some embodiments, as shown in FIG. 10, the connecting lead 70 includes at least two first connecting lines 700, and the at least two first connecting lines 700 are coupled to the conductive frame 80.

For example, the conductive frame 80 may be made of a metal material, such as copper, aluminum, or molybdenum.

Since the material of the common electrode 20 is different from the material of the first common signal line(s) 30, the first common signal line(s) 30 are coupled to the portion of the common electrode 20 located in the distal region F through the connecting lead 70 and the conductive frame 80, and the feedback signal line(s) 40 are coupled to the portion of the common electrode 20 located in the distal region F through the conductive frame 80, which may reduce a contact resistance between the first common signal line 30 and the common electrode 20 and a contact resistance between the feedback signal line 40 and the common electrode 20, and may reduce a loss of signal transmission between the first common signal line 30 and the common electrode 20 and a loss of signal transmission between the feedback signal line 40 and the common electrode 20.

In some embodiments, as shown in FIG. 10, in a case where the array substrate 100 includes the second common signal line(s) 50 and the third common signal line(s) 60, the second common signal line(s) 50 and the third common signal line(s) 60 are coupled to the common electrode 20 through the conductive frame 80. In this case, a contact resistance between the second common signal line 50 and the common electrode 20 and a contact resistance between the third common signal line 60 and the common electrode 20 may be reduced, and a loss of signal transmission between the second common signal line 50 and the common electrode 20 and a loss of signal transmission between the third common signal line 60 and the common electrode 20 may be reduced. For example, the conductive frame 80 includes portions respectively located in the second region, the third region and the fourth region. The array substrate 100 further includes a plurality of second connecting lines 80a located on a side of the common electrode 20 proximate to the third region 103, and the conductive frame 80 is coupled to the common electrode 20 through the plurality of second connecting lines 80a. And/or, the array substrate 100 further includes a plurality of third connecting lines 80b located on a side of the common electrode 20 proximate to the fourth region 104, and the conductive frame 80 is coupled to the common electrode 20 through the plurality of third connecting lines 80b. For example, the plurality of second connecting lines 80a and the plurality of third connecting lines 80b are disposed symmetrically about a midline L0 of the display area AA in the second direction Y.

In some embodiments, the first common signal line(s) 30, the connecting lead 70 and the conductive frame 80 are made of a same material and disposed in a same layer.

In this case, the first common signal line(s) 30, the connecting lead 70 and the conductive frame 80 may be formed synchronously, so that the production processes may be simplified in terms of process.

In some embodiments, in a case where the array substrate 100 further includes the second common signal line(s) 50 and the third common signal line(s) 60, a resistance of the first common signal line 30, a resistance of the second common signal line 50, and a resistance of the third common signal line 60 are all less than or equal to 300Ω. A resistance of the feedback signal line 40 is less than or equal to 1000Ω.

It will be noted that in a case where the array substrate 100 is applied to a display apparatus, specific values of the resistances of the first common signal line 30, the second common signal line 50, the third common signal line 60, and the feedback signal line 40 may be set by a person skilled in the art according to actual conditions (e.g., different resolution and other factors) of the display apparatus.

For example, the resistance $(R_{V1})$ of the first common signal line 30, the resistance $(R_{V2})$ of the second common signal line 50, the resistance $(R_{V3})$ of the third common signal line 60, and the resistance $(R_{VF})$ of the feedback signal line 40 satisfy $R_{V1}:R_{V2}:R_{V3}:R_{VF}=2:1:2:5$. For example, the resistance of the first common signal line 30 is 200Ω, the resistance of the second common signal line 50 is 100Ω, the resistance of the third common signal line 60 is 200Ω, and the resistance of the feedback signal line 40 is 500Ω.

Figure 11:
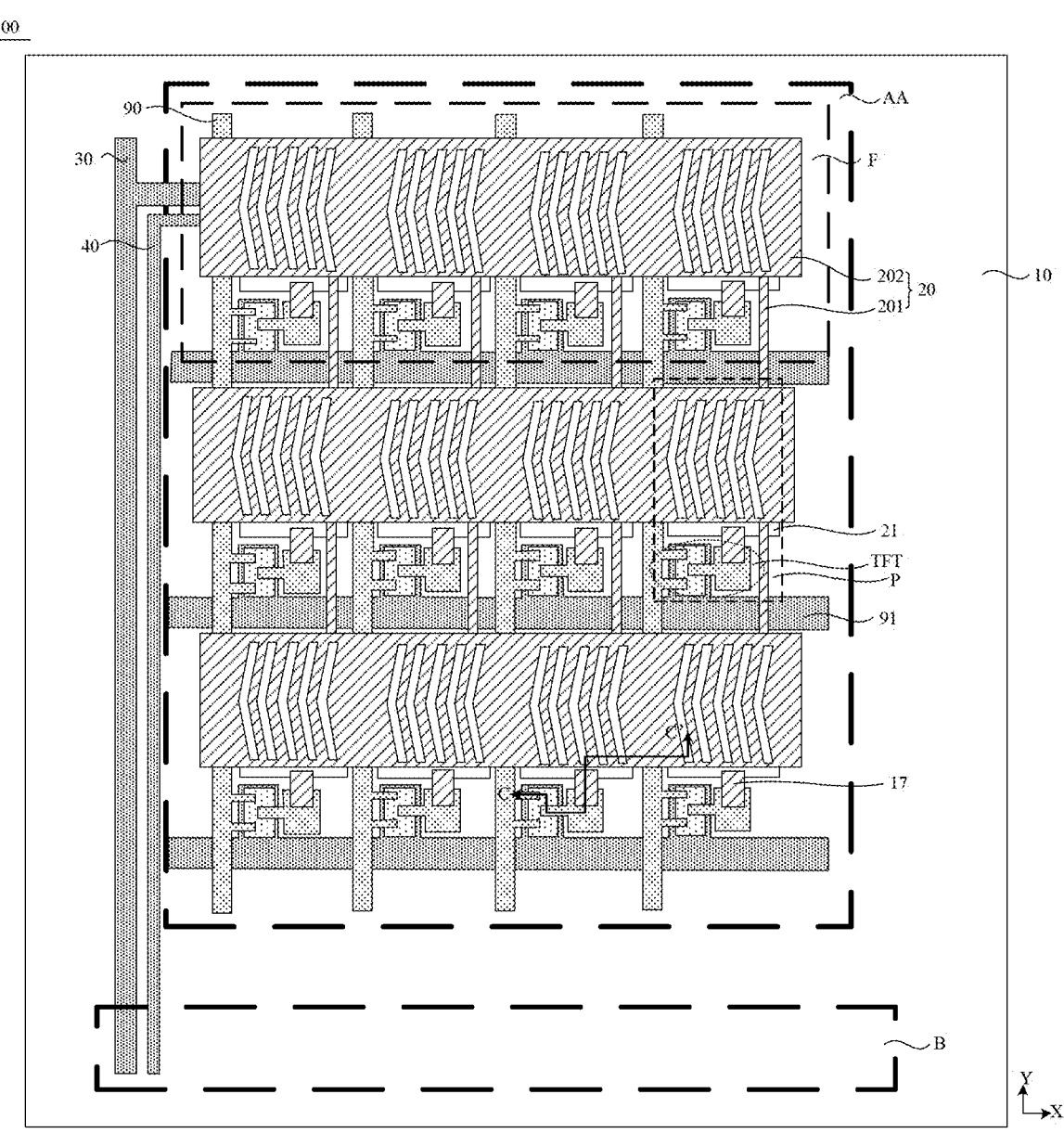
FIG. 11 is a top view of yet another array substrate, in accordance with some embodiments.

In some embodiments, as shown in FIG. 11, the array substrate 100 has a plurality of sub-pixel regions P. The common electrode 20 includes a plurality of sub-electrodes 202 and a plurality of first conductive patterns 201.

A sub-electrode 202 is located in at least one sub-pixel region P. Adjacent sub-electrodes 202 are coupled through at least one first conductive pattern 201.

In this case, the sub-electrodes 202 in all the sub-pixel regions P may be connected as a whole through the first conductive patterns 201. Therefore, when the first common signal line 30 transmits the compensated common voltage signal to the sub-electrodes 202 located in the distal region F, the compensated common voltage signal may be transmitted to all the sub-electrodes 202, and common voltage signals of all the sub-electrodes 202 may be compensated, thereby preventing the common voltage signals of the sub-electrodes 202 from being delayed.

In some embodiments, as shown in FIG. 11, the array substrate 100 further includes data lines 90 disposed on the base 10.

Figure 12:
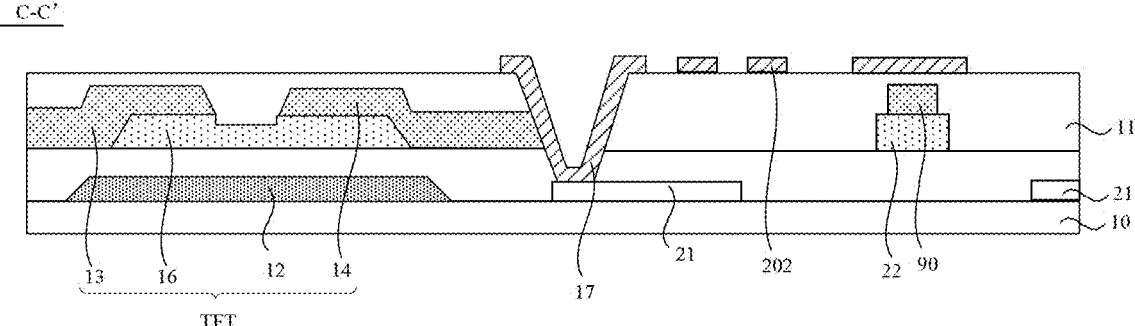
FIG. 12 is a sectional view of the array substrate in FIG. 11 taken along the C-C' direction.

As shown in FIG. 12, the data lines 90 are arranged closer to the base 10 than the common electrode 20 in a direction perpendicular to the base 10. Orthogonal projections of the data lines 90 on the base 10 at least partially overlap with an orthogonal projection of the common electrode 20 on the base 10.

Figure 13:
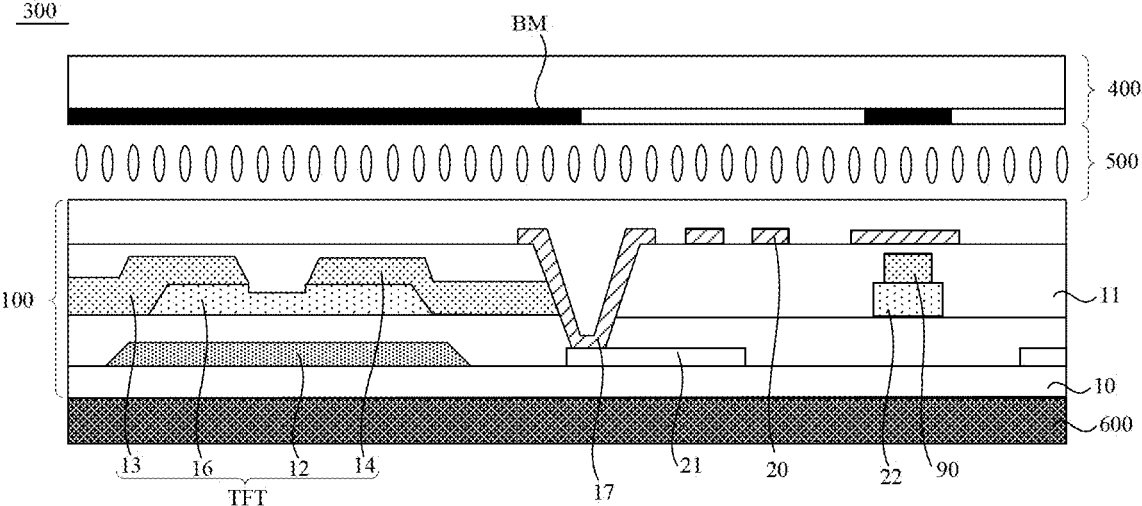
FIG. 13 is a diagram showing a structure of a display apparatus, in accordance with some embodiments.

In some embodiments, in a case where the array substrate 100 is applied to the display apparatus, as shown in FIG. 13, a display apparatus 300 includes an opposite substrate 400 disposed opposite to the array substrate 100, a liquid crystal layer 500 disposed between the array substrate 100 and the opposite substrate 400, and a backlight module 600 disposed on a side of the array substrate 100 away from the opposite substrate 400. The opposite substrate 400 includes a black matrix (BM).

On this basis, since the orthogonal projection of the data line 90 on the base 10 at least partially overlaps with the orthogonal projection of the common electrode 20 on the base 10, an electric field will be formed between the data line 90 and the common electrode 20 upon application of power, so that liquid crystal molecules in the liquid crystal layer 500 rotates under an action of the electric field, which may prevent light emitted from the backlight module 600 from leaking at a position of the data line 90, so as to reduce an area of the black matrix at the position of the data line 90, thereby increasing an aperture ratio and facilitating a realization of the narrow bezel of the display apparatus 300.

In some embodiments, as shown in FIGS. 11 and 12, the array substrate 100 further includes a thin film transistor (TFT) disposed in the sub-pixel region P.

As shown in FIG. 11, the plurality of sub-pixel regions P may be arranged in an array. Sub-pixel regions P arranged in a row direction X are referred to as sub-pixel regions in a same row, and sub-pixel regions P arranged in a column direction Y are referred to as sub-pixel regions in a same column. The TFTs in the sub-pixel regions in the same row may be electrically connected to a gate line 91. The TFTs in the sub-pixel regions in the same column may be electrically connected to the data line 90. In this case, a sub-electrode 202 may correspond to the sub-pixel regions in the same row, and sub-electrodes 202 in two adjacent rows are coupled through the first conductive pattern 201.

In some embodiments, the first common signal line(s) 30 and the gate line(s) 91 are made of a same material and disposed in a same layer. Therefore, the first common signal line(s) 30 and the gate line(s) 91 may be formed synchronously in terms of process.

In addition, in some embodiments, as shown in FIGS. 11 and 12, the array substrate 100 further includes pixel electrodes 21 disposed on a side of the common electrode 20 proximate to the base 10. The TFT includes a gate 12, an active layer 16, and a source 13 and a drain 14 that are disposed on the base 10 in sequence. A pixel electrode 21 is coupled to the drain 14 of the TFT through a second conductive pattern 17, and the second conductive pattern 17 and the common electrode 20 are made of a same material and disposed in a same layer. The array substrate 100 further includes a semiconductor pattern 22, the semiconductor pattern 22 is located on a side of the data line 90 proximate to the base 10, and the semiconductor pattern 22 and the active layer 16 of the TFT are made of a same material and disposed in a same layer.

In terms of process, referring to FIGS. 11 and 12, the pixel electrode 21 is formed on the base 10; the gate 12 and the active layer 16 of the TFT are sequentially formed on a side of the pixel electrode 21 away from the base; the source 13 and the drain 14 are formed on a side of the active layer 16 away from the base 10 by using a single slit mask (SSM); a passivation layer 11 is formed on a side of the TFT away from the base 10; and the common electrode 20 is formed on a side of the passivation layer 11 away from the base 10.

Figure 14:
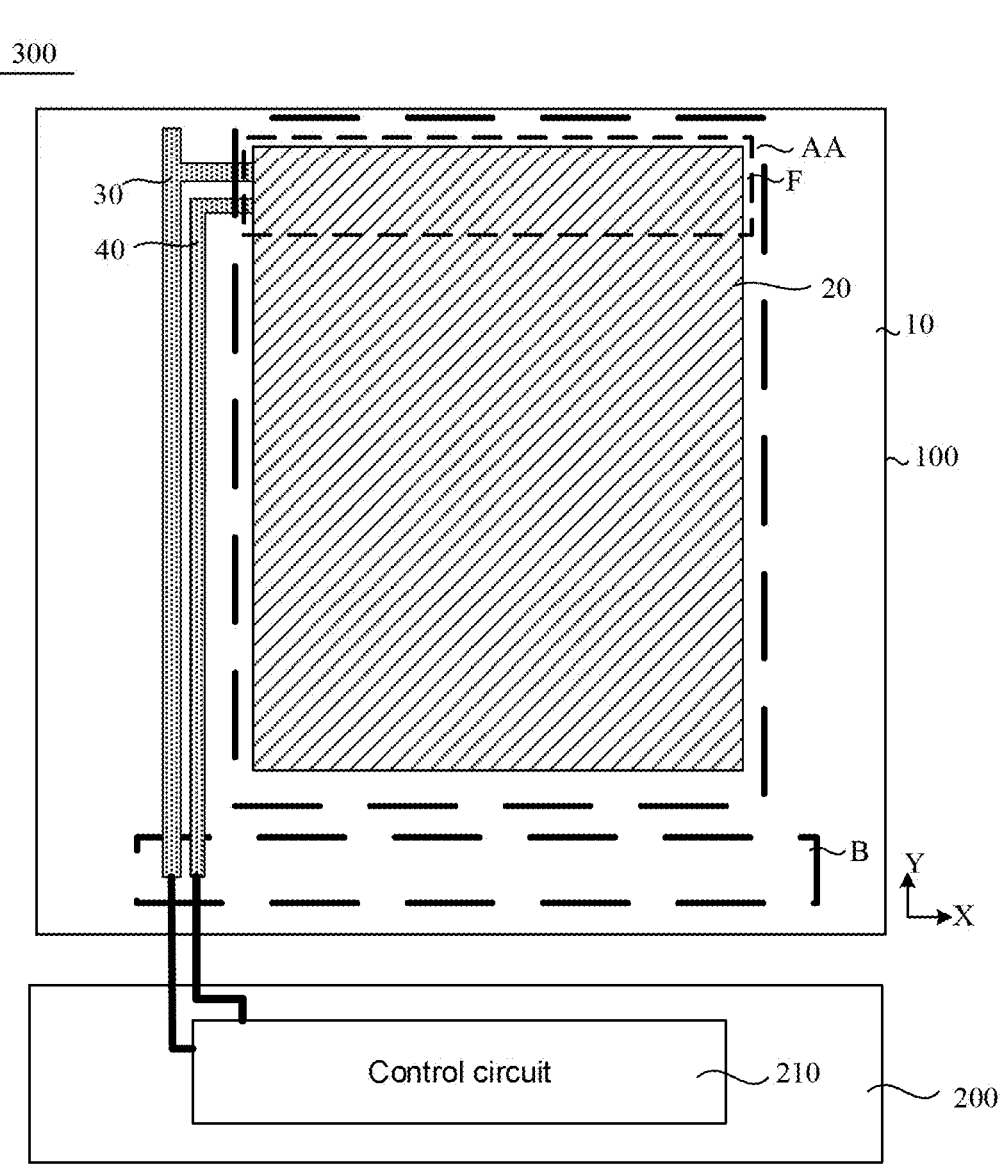
FIG. 14 is a diagram showing a structure of another display apparatus, in accordance with some embodiments.

The embodiments of the present disclosure further provide the display apparatus 300. As shown in FIG. 14, the display apparatus 300 includes the array substrate 100 in any of the above embodiments and a circuit board 200.

The circuit board 200 is bonded to the bonding region B in the array substrate 100.

The circuit board 200 includes a control circuit 210, and the control circuit 210 is coupled to the first common signal line 30 and the feedback signal line 40 in the array substrate 100.

The control circuit 210 is configured to generate a first compensation common voltage signal according to the common voltage signal transmitted by the feedback signal line 40, and transmit the first compensation common voltage signal to the first common signal line 30.

It will be understood that the first compensation common voltage signal is obtained after the control circuit 210 compensates for the common voltage signal according to the common voltage signal.

The feedback signal line 40 and the first common signal line 30 are coupled to the portion of the common electrode 20 located in the distal region F.

For example, the circuit board 200 may be a printed circuit board (PCB) or a flexible printed circuit (FPC) board or the like.

Therefore, the first compensation common voltage signal generated by the control circuit 210 according to the common voltage signal transmitted by the feedback signal line 40 is transmitted to the portion of the common electrode 20 located in the distal region F through the first common signal line 30, so as to compensate for the common voltage signal of the portion of the common electrode 20 located in the distal region F. As a result, the delay in the common voltage signal of the portion of the common electrode 20 located in the distal region F may be avoided, thereby improving the display effect.

Figure 15:
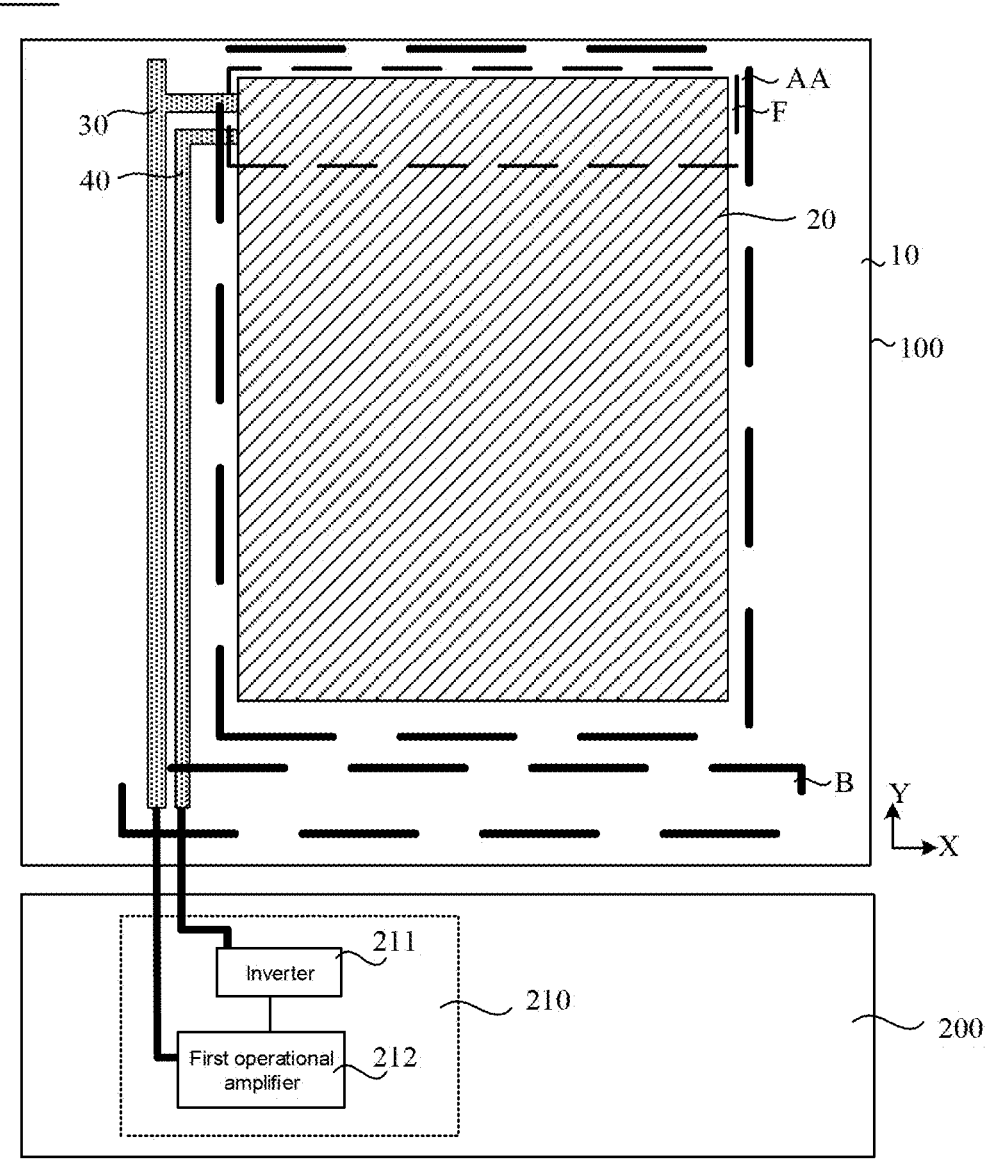
FIG. 15 is a diagram showing a structure of yet another display apparatus, in accordance with some embodiments.

In some embodiments, as shown in FIG. 15, the control circuit 210 includes an inverter 211 and a first operational amplifier 212.

The inverter 211 is coupled to the feedback signal line 40.

The first operational amplifier 212 is coupled to the inverter 211 and the first common signal line 30.

The inverter 211 is configured to invert the common voltage signal transmitted by the feedback signal line 40.

The first operational amplifier 212 is configured to amplify an inverted signal from the inverter 211 to generate the first compensation common voltage signal, and transmit the first compensation common voltage signal to the first common signal line 30.

On this basis, the common voltage signal transmitted by the feedback signal line 40 (i.e., the common voltage signal of the portion of the common electrode 20 located in the distal region F) is distorted and potential drift occurs. After the common voltage signal is inverted by the inverter 211 and amplified by the first operational amplifier 212, the generated first compensation common voltage signal may compensate for the distorted common voltage signal of the portion of the common electrode 20 located in the distal region F, thereby avoiding the delay in the common voltage signal of the portion of the common electrode 20 located in the distal region F.

Figure 16:
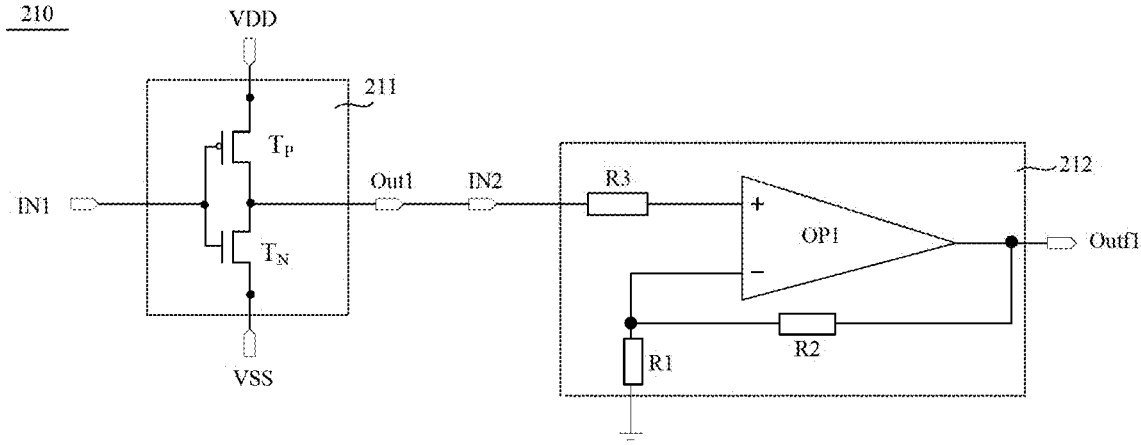
FIG. 16 is a diagram showing a structure of a control circuit, in accordance with some embodiments.

For example, as shown in FIG. 16, the inverter 211 includes an N-type transistor $T_N$ and a P-type transistor $T_P$. A control electrode of the N-type transistor $T_N$ is coupled to a first input terminal IN1, a first electrode of the N-type transistor $T_N$ is coupled to a first voltage terminal VSS, and a second electrode of the N-type transistor $T_N$ is coupled to a first output terminal Out1. A control electrode of the P-type transistor $T_P$ is coupled to the first input terminal IN1, a first electrode of the P-type transistor $T_P$ is coupled to a second voltage terminal VDD, and a second electrode of the P-type transistor $T_P$ is coupled to the first output terminal Out1.

The first input terminal IN1 is coupled to the feedback signal line 40, and the first output terminal Out1 is coupled to the first operational amplifier 212.

A voltage of the first voltage terminal VSS and a voltage of the second voltage terminal VDD are each an operating voltage of the inverter 211. When the inverter 211 is operating, the voltage of the first voltage terminal VSS is at a direct current low level and may be used as a negative electrode of a power supply, and the voltage of the second voltage terminal VDD is at a direct current high level and may be used as a positive electrode of the power supply.

In this case, when a voltage of the common voltage signal transmitted by the feedback signal line 40 makes the N-type transistor $T_N$ turned on, the P-type transistor $T_P$ is turned off, the common voltage signal is a high-level signal, the N-type transistor $T_N$ transmits a first voltage signal received from the first voltage terminal VSS to the first output terminal Out1, and a signal of the first output terminal Out1 is a low-level signal, which realizes an inversion of the common voltage signal. Similarly, when the voltage of the common voltage signal transmitted by the feedback signal line 40 makes the P-type transistor $T_P$ turned on, the N-type transistor $T_N$ is turned off, the common voltage signal is a low-level signal, the P-type transistor $T_P$ transmits a second voltage signal received from the second voltage terminal VDD to the first output terminal Out1, and the signal of the first output terminal Out1 is a high-level signal, which realizes an inversion of the common voltage signal.

For example, as shown in FIG. 16, the first operational amplifier 212 includes a first amplifier OP1, a first resistor R1, a second resistor R2, and a third transistor R3.

A positive input terminal of the first amplifier OP1 is coupled to a second end of the third resistor R3, a negative input terminal of the first amplifier OP1 is coupled to a first end of the first resistor R1 and a first end of the second resistor R2, and an output terminal of the first amplifier OP1 is coupled to a first compensation common voltage signal output terminal Outf1.

A second end of the first resistor R1 is grounded.

A second end of the second resistor R2 is coupled to the first compensation common voltage signal output terminal Outf1.

A first end of the third resistor R3 is coupled to a second input terminal IN2.

The second input terminal IN2 is coupled to the first output terminal Out1 of the inverter 211, and the first compensation common voltage signal output terminal Outf1 is coupled to the first common signal line 20.

The third resistor R3 is a balance resistor, and the resistance of R3 is the resistance of R1 and R2 in parallel, i.e., R3=R1//R2, which may avoid an influence of an input bias current of the first operational amplifier 212 on an output.

It will be understood that a signal $V_{IN2}$ received at the second input terminal IN2 is an inverted signal from the inverter 211, and the inverted signal is an inversion of the common voltage signal. In this case, a first compensation common voltage signal $V_{f1}$ generated by the first operational amplifier 212 is equal to (1+R2/R1) by $V_{IN2}$, i.e., $V_{f1}$=(1+R2/R1)×$V_{IN2}$, and an amplification factor of the first operational amplifier 212 is (1+R2/R1).

It will be noted that those skilled in the art may set the amplification factor of the first operational amplifier 212 according to actual conditions (e.g., different resolution, etc.), and select the first resistor R1 and the second resistor R2 with suitable resistance values according to a required amplification factor.

Figure 17:
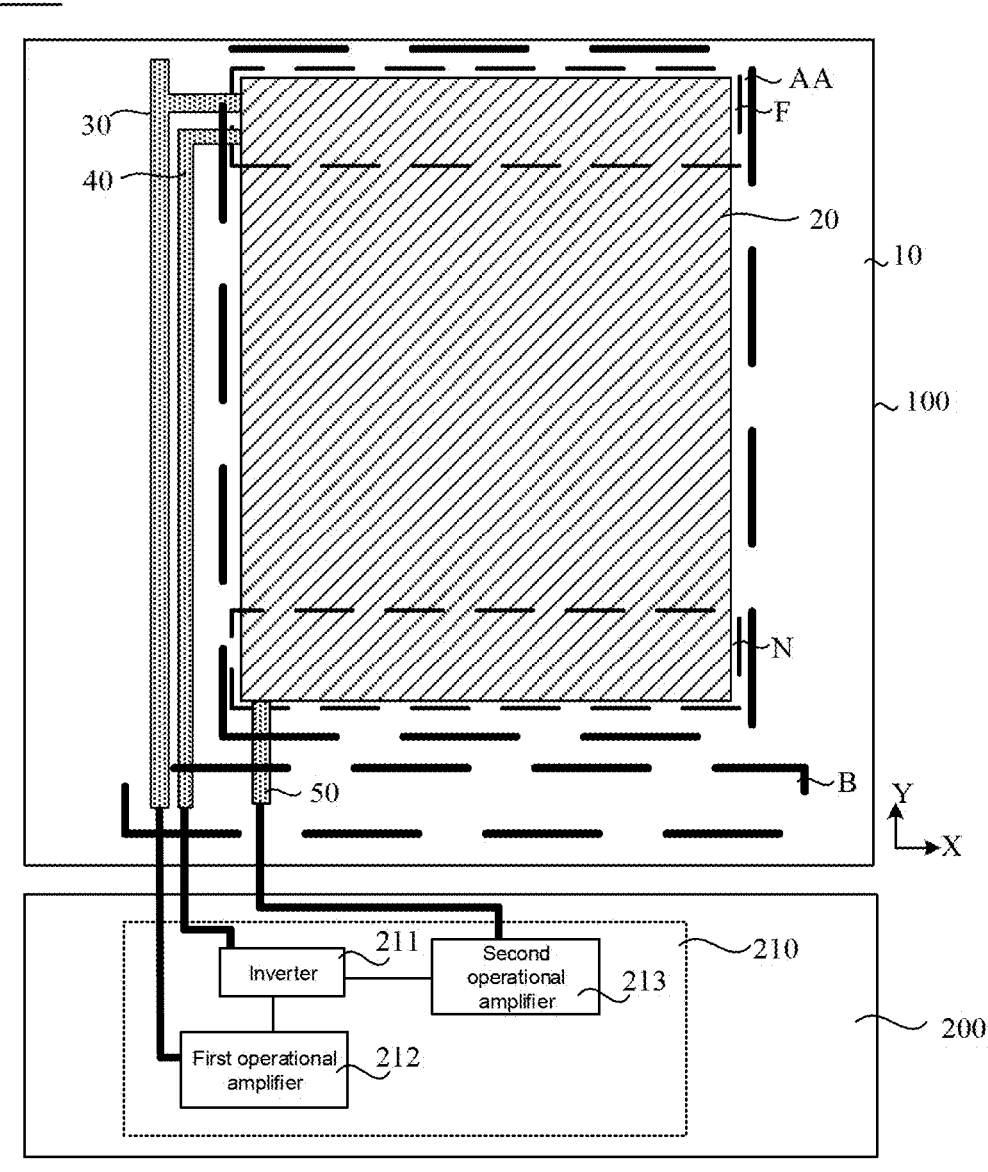
FIG. 17 is a diagram showing a structure of yet another display apparatus, in accordance with some embodiments.

In some embodiments, as shown in FIG. 17, in a case where the array substrate 100 further includes the second common signal line(s) 50, the control circuit 210 further includes a second operational amplifier 213.

The second operational amplifier 213 is coupled to the inverter 211 and the second common signal line 50. The second operational amplifier 213 is configured to amplify the inverted signal from the inverter 211 to generate a second compensation common voltage signal, and transmit the second compensation common voltage signal to the second common signal line 50.

An amplification factor of the second operational amplifier 213 is less than the amplification factor of the first operational amplifier 212.

On this basis, the common voltage signal transmitted by the feedback signal line 40 (i.e., the common voltage signal of the portion of the common electrode 20 located in the distal region F) is distorted and potential drift occurs. Since a delay degree of the common voltage signal of the portion of the common electrode 20 located in the proximal region N is less than a delay degree of the common voltage signal of the portion of the common electrode 20 located in the distal region F, the second compensation common voltage signal generated by the second operational amplifier 213 amplifying the inverted signal may compensate for the distorted common voltage signal of the portion of the common electrode 20 located in the proximal region N, thereby avoiding the delay in the common voltage signal of the portion of the common electrode 20 located in the proximal region N.

Figure 18:
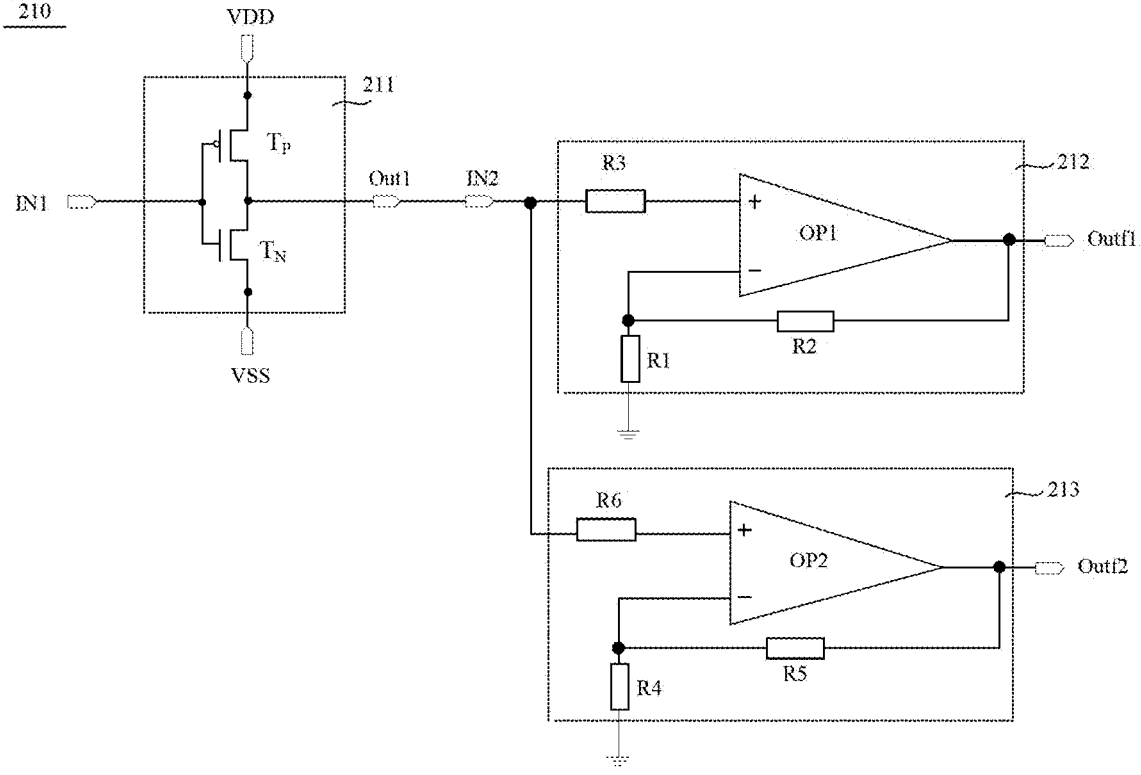
FIG. 18 is a diagram showing a structure of another control circuit, in accordance with some embodiments.

For example, as shown in FIG. 18, the second operational amplifier 213 includes a second amplifier OP2, a fourth resistor R4, a fifth resistor R5, and a sixth resistor R6.

A positive input terminal of the second amplifier OP2 is coupled to a second end of the sixth resistor R6, a negative input terminal of the second amplifier OP2 is coupled to a first end of the fourth resistor R4 and a first end of the fifth resistor R5, and an output terminal of the second amplifier OP2 is coupled to a second compensation common voltage signal output terminal Outf2.

A second end of the fourth resistor R4 is grounded.

A second end of the fifth resistor R5 is coupled to the second compensation common voltage signal output terminal Outf2.

A first end of the sixth resistor R6 is coupled to the second input terminal IN2. The second compensation common voltage signal output terminal Outf2 is coupled to the second common signal line 50.

The sixth resistor R6 is a balance resistor, and the resistance of R6 is the resistance of R4 and R5 in parallel, i.e., R6=R4//R5, which may avoid an influence of an input bias current of the second operational amplifier 213 on an output.

In this case, a second compensation common signal $V_{f2}$ generated by the second operational amplifier 213 is equal to (1+R5/R4) by $V_{IN2}$, i.e., $V_{f2}$=(1+R5/R4)×$V_{IN2}$, and the amplification factor of the second operational amplifier 213 is (1+R5/R4).

It will be noted that those skilled in the art may set the amplification factor of the second operational amplifier 213 according to actual conditions (e.g., different resolution, etc.), and select the fourth resistor R4 and the fifth resistor R5 with suitable resistance values according to a required amplification factor.

Figure 19:
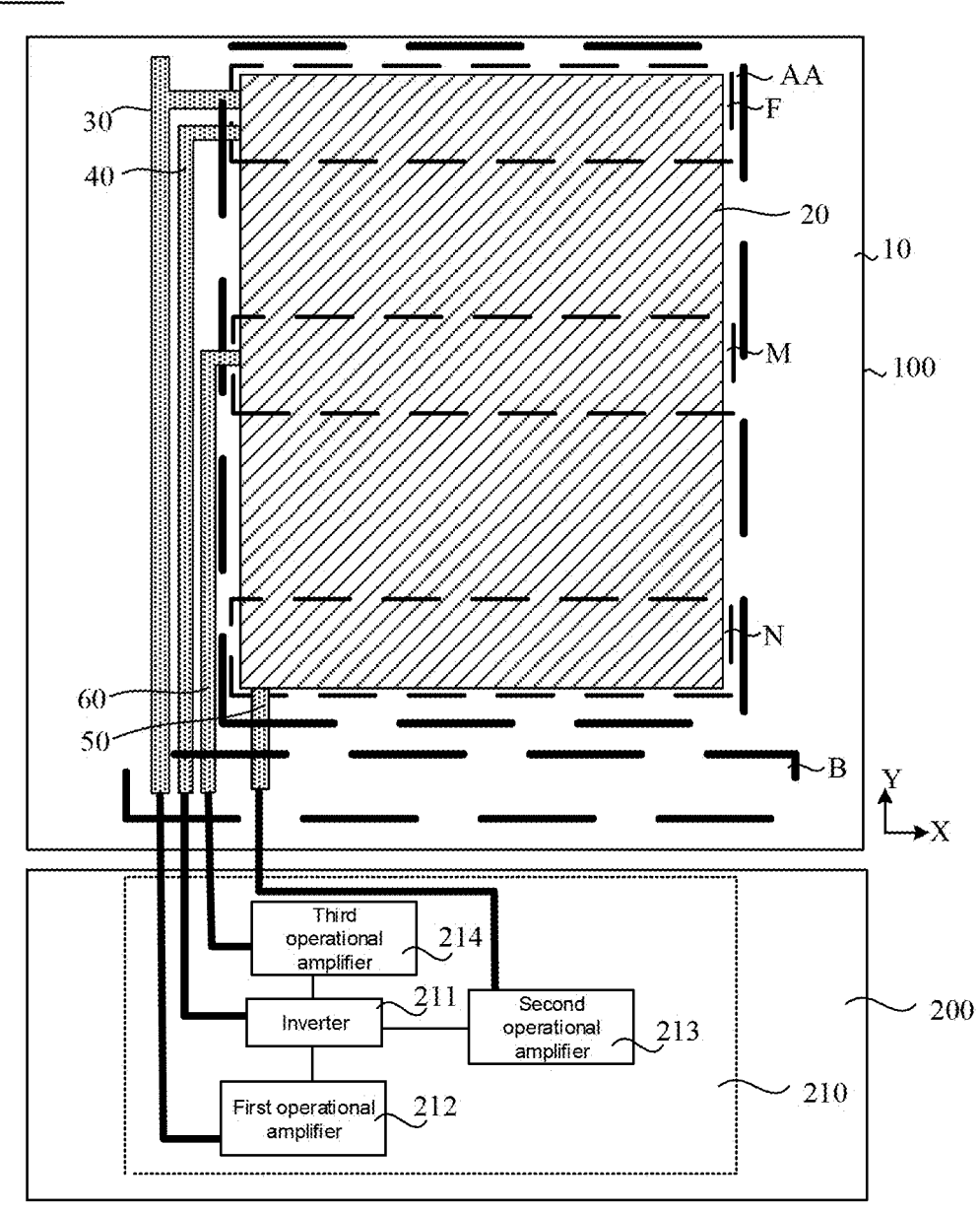
FIG. 19 is a diagram showing a structure of yet another display apparatus, in accordance with some embodiments.

In some embodiments, as shown in FIG. 19, in a case where the array substrate 100 further includes the third common signal line(s) 60, the control circuit 210 further includes a third operational amplifier 214.

The third operational amplifier 214 is coupled to the inverter 211 and the third common signal line 60. The third operational amplifier 214 is configured to amplify the inverted signal from the inverter 211 to generate a third compensation common voltage signal, and transmit the third compensation common voltage signal to the third common signal line 60.

An amplification factor of the third operational amplifier 214 is less than the amplification factor of the first operational amplifier 212.

In a case where the control circuit 210 further includes the second operational amplifier 213, the amplification factor of the third operational amplifier 214 is greater than the amplification factor of the second operational amplifier 213.

On this basis, the common voltage signal transmitted by the feedback signal line 40 (i.e., the common voltage signal of the portion of the common electrode 20 located in the distal region F) is distorted and potential drift occurs. Since a delay degree of the common voltage signal of the portion of the common electrode 20 located in the middle region M is less than the delay degree of the common voltage signal of the portion of the common electrode 20 located in the distal region F, and is greater than the delay degree of the common voltage signal of the portion of the common electrode 20 located in the proximal region N, the third compensation common voltage signal generated by the third operational amplifier 214 amplifying the inverted signal may compensate for the distorted common voltage signal of the portion of the common electrode 20 located in the middle region M, thereby avoiding the delay in the common voltage signal of the portion of the common electrode 20 located in the middle region M.

Figure 20:
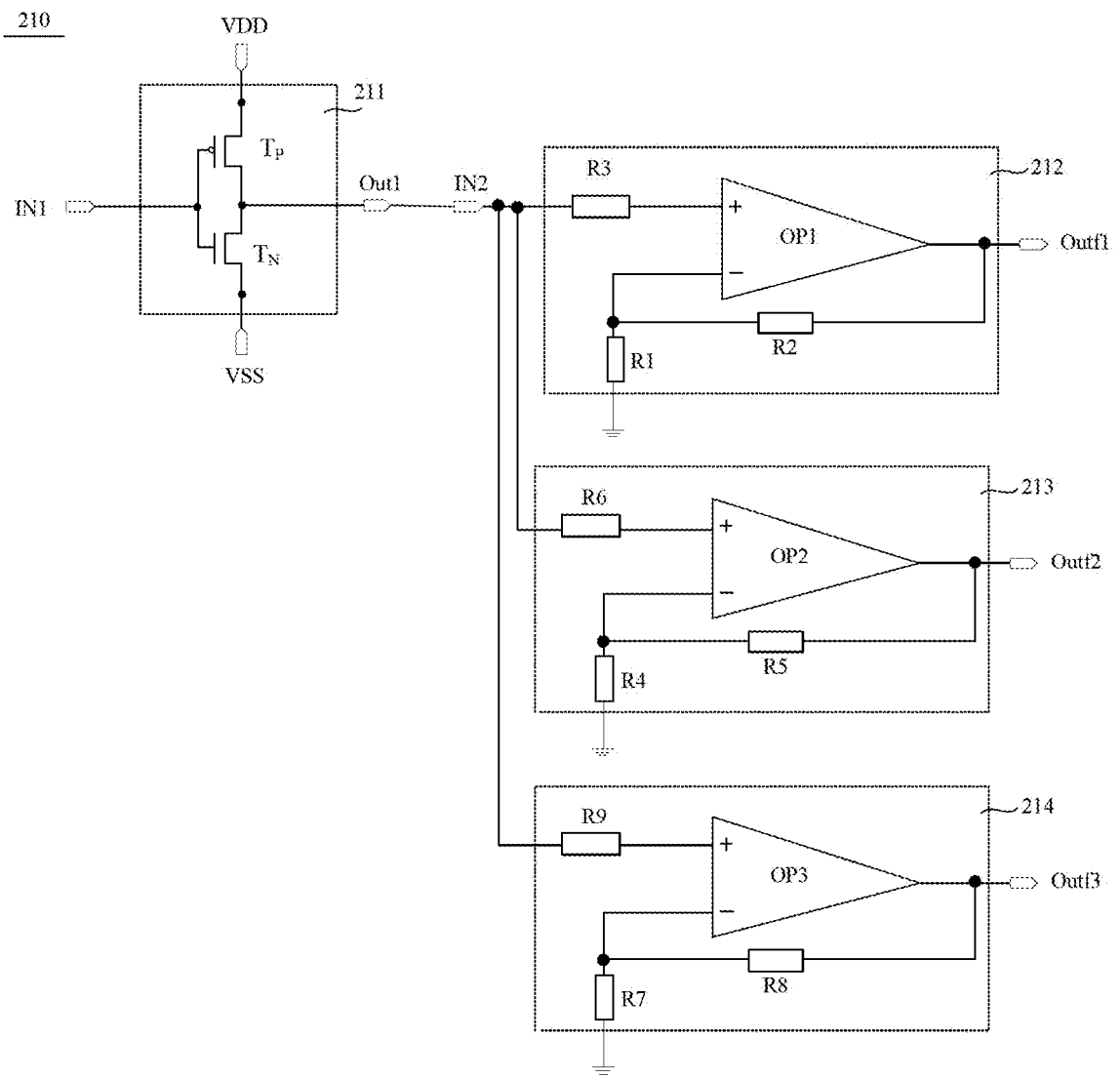
FIG. 20 is a diagram showing a structure of yet another control circuit, in accordance with some embodiments.

For example, as shown in FIG. 20, the third operational amplifier 214 includes a third amplifier OP3, a seventh resistor R7, an eighth resistor R8, and a ninth resistor R9.

A positive input terminal of the third amplifier OP3 is coupled to a second end of the ninth resistor R9, a negative input terminal of the third amplifier OP3 is coupled to a first end of the seventh resistor R7 and a first end of the eighth resistor R8, and an output terminal of the third amplifier OP3 is coupled to a third compensation common voltage signal output terminal Outf3.

A second end of the seventh resistor R7 is grounded.

A second end of the eighth resistor R8 is coupled to the third compensation common voltage signal output terminal Outf3.

A first end of the ninth resistor R9 is coupled to the second input terminal IN2.

The third compensation common voltage signal output terminal Outf3 is coupled to the third common signal line 60.

The ninth resistor R9 is a balance resistor, and he resistance of R9 is the resistance of R7 and R8 in parallel, i.e., R9=R7//R8, which may avoid an influence of an input bias current of the third operational amplifier 214 on an output.

In this case, a third compensation common voltage signal $V_{f3}$ generated by the third operational amplifier 214 is equal to (1+R8/R7) by $V_{IN2}$, i.e., $V_{f3}$=(1+R8/R7)×$V_{IN2}$. The amplification factor of the third operational amplifier 214 is (1+R8/R7).

It will be noted that relationships among the amplification factors of the first operational amplifier 212, the second operational amplifier 213, and the third operational amplifier 214 in different display apparatuses are all different. Ranges of the amplification factor of the first operational amplifier 212, the amplification factor of the second operational amplifier 213, and the amplification factor of the third operational amplifier 214 may be determined according to actual conditions of the display apparatus, such as the resolution and pixel structures. In addition, resistance values of the first resistor R1 and the second resistor R2 in the first operational amplifier 212, resistance values of the fourth resistor R4 and the fifth resistor R5 in the second operational amplifier 213, and resistance values of the seventh resistor R7 and the eighth resistor R8 in the third operational amplifier 214 are set in advance through multiple experiments and tests on the display apparatus before delivery.

In addition, the display apparatus 300 may be any apparatus that can display images whether in motion (e.g., a video) or stationary (e.g., a static image), and regardless of text or image. More specifically, it is anticipated that the described embodiments may be implemented in or associated with a variety of electronic devices. The variety of electronic devices may be (but not limited to), e.g., a mobile phone, a wireless device, a personal data assistant (PDA), a hand-held or portable computer, a global positioning system (GPS) receiver/navigator, a camera, an MPEG-4 Part 14 (MP4) video player, a video camera, a game console, a watch, a clock, a calculator, a television monitor, a flat panel display, a computer monitor, a car display (e.g., an odometer display), a navigator, a cockpit controller and/or display, a display of camera view (e.g., a display of a rear view camera in a vehicle), an electronic photo, an electronic billboard or sign, a projector, a building structure, and a packaging and an aesthetic structure (e.g., a display for an image of a piece of jewelry).

On the basis of the above, the embodiments of the present disclosure further provide a control method of the display apparatus 300 as described in any of the above embodiments, including:

transmitting, by the feedback signal line 40, the common voltage signal of the portion of the common electrode 20 located in the distal region F to the control circuit 210 in the circuit board 200; and generating, by the control circuit 210, the first compensation common voltage signal according to the common voltage signal transmitted by the feedback signal line 40, and transmitting, by the control circuit 210, the first compensation common voltage signal to the first common signal line 30, so as to compensate for the common voltage signal of the portion of the common electrode 20 located in the distal region F.

In some embodiments, the control method of the display apparatus 300 further includes:

generating, by the control circuit 210, the second compensation common voltage signal according to the common voltage signal transmitted by the feedback signal line, and transmitting, by the control circuit 210, the second compensation common voltage signal to the second common signal line 50, so as to compensate for the common voltage signal of the portion of the common electrode 20 located in the proximal region N.

In some embodiments, the control method of the display apparatus 300 further includes:

generating, by the control circuit 210, the third compensation common voltage signal according to the common voltage signal transmitted by the feedback signal line 40, and transmitting, by the control circuit 210, the third compensation common voltage signal to the third common signal line 60, so as to compensate for the common voltage signal of the portion of the common electrode 20 located in the middle region M.

Beneficial effects that may be achieved by the control method of the display apparatus 300 provided by the embodiments of the present disclosure are the same as beneficial effects of the above display apparatus 300, and will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate having a display area and a bonding region located at a side of the display area; the display area including gate lines extending in a first direction and arranged in a second direction, the first direction intersecting the second direction; the bonding region corresponding to a first region, the first region extending in the first direction; the array substrate further having a second region, a third region and a fourth region, the second region extending in the first direction; the first region and the second region being opposite in the second direction, and the third region and the fourth region being opposite in the first direction; the display area being located between the first region and the second region and between the third region and the fourth region; the display area including a distal region away from the bonding region and a proximal region proximate to the bonding region; the array substrate comprising:

a base;

a common electrode disposed on the base and located in the display area;

at least one first common signal line disposed on the base; the at least one first common signal line being disposed in the third region and/or the fourth region; the at least one first common signal line being coupled to the common electrode;

a connecting lead disposed in the second region; the at least one first common signal line being coupled to the connecting lead; and a conductive frame, at least part of the conductive frame being located in the second region; the connecting lead and the common electrode being coupled to the conductive frame, so that the at least one first common signal line is coupled to the common electrode through the connecting lead and the conductive frame; wherein the connecting lead includes at least two first connecting lines, and the at least two first connecting lines are coupled to the conductive frame; the display area further includes a pixel electrode and a thin film transistor, and the pixel electrode is couple to the thin film transistor; and the conductive frame is further located in the third region; the array substrate further comprises a plurality of second connecting lines located on a side of the common electrode proximate to the third region, and the conductive frame is coupled to the common electrode through the plurality of second connecting lines.

2. The array substrate according to claim 1, wherein the conductive frame is further located in the fourth region; the array substrate further comprises a plurality of third connecting lines located on a side of the common electrode proximate to the fourth region, and the conductive frame is coupled to the common electrode through the plurality of third connecting lines.

3. The array substrate according to claim 2, wherein the plurality of second connecting lines and the plurality of third connecting lines are disposed symmetrically about a midline of the display area in the second direction.

4. The array substrate according to claim 1, further comprising at least one second common signal line disposed on the base; the at least one second common signal line being disposed in the third region and/or the fourth region; the at least one second common signal line being coupled to the common electrode.

5. The array substrate according to claim 4, further comprising at least one third common signal line disposed on the base; the at least one third common signal line being disposed in the third region and/or the fourth region, and a third common signal line being disposed between a first common signal line and the display area; wherein the display area further includes a middle region located between the distal region and the proximal region;

the at least one first common signal line is coupled to a portion of the common electrode located in the distal region and extending to the bonding region;

the at least one second common signal line is coupled to a portion of the common electrode located in the proximal region and extending to the bonding region; and the at least one third common signal line is coupled to a portion of the common electrode located in the middle region and extending to the bonding region.

6. The array substrate according to claim 5, further comprising at least one feedback signal line disposed on the base; the at least one feedback signal line being coupled to the portion of the common electrode located in the distal region and extending to the bonding region, and a feedback signal line being disposed between the first common signal line and the third common signal line; wherein the feedback signal line in the at least one feedback signal line is configured to transmit a common voltage signal of the portion of the common electrode located in the distal region.

7. The array substrate according to claim 6, wherein the at least one feedback signal line includes two feedback signal lines, and the two feedback signal lines are disposed in the third region and the fourth region, respectively.

8. The array substrate according to claim 4, wherein the at least one second common signal line includes two second common signal lines, and the two second common signal lines are disposed at two opposite ends of a side of the proximal region proximate to the bonding region.

9. The array substrate according to claim 5, wherein the at least one third common signal line includes two third common signal lines, and the two third common signal lines are disposed on two opposite sides of the display area.

10. The array substrate according to claim 6, wherein the at least one feedback signal line and the at least one first common signal line are made of a same material and disposed in a same layer; and/or the at least one feedback signal line is coupled to the conductive frame, so that the at least one feedback signal line is coupled to the portion of the common electrode located in the distal region through the conductive frame.

11. The array substrate according to claim 6, wherein a resistance of the first common signal line, a resistance of the second common signal line, and a resistance of the third common signal line are all less than or equal to 300Ω; and a resistance of the feedback signal line is less than or equal to 1000Ω.

12. The array substrate according to claim 1, wherein the connecting lead and the portion of the common electrode located in the distal region are coupled to the conductive frame, so that the at least one first common signal line is coupled to the portion of the common electrode located in the distal region through the connecting lead and the conductive frame.

13. The array substrate according to claim 1, wherein the at least one first common signal line includes two first common signal lines, and the two first common signal lines are disposed in the third region and the fourth region, respectively.

14. The array substrate according to claim 1, wherein the at least one first common signal line, the connecting lead and the conductive frame are made of a same material and disposed in a same layer.

15. The array substrate according to claim 1, further comprising:

data lines disposed on the base, the data lines being arranged closer to the base than the common electrode in a direction perpendicular to the base; wherein orthogonal projections of the data lines on the base at least partially overlap with an orthogonal projection of the common electrode on the base.

16. The array substrate according to claim 1, wherein the array substrate has a plurality of sub-pixel regions;

the common electrode includes a plurality of sub-electrodes and a plurality of first conductive patterns; and a sub-electrode is located in at least one sub-pixel region, and adjacent sub-electrodes are coupled through at least one first conductive pattern.

17. A display apparatus, comprising:

the array substrate according to claim 1; and a circuit board bonded to the bonding region in the array substrate; the circuit board including a control circuit, and the control circuit being coupled to the first common signal line in the array substrate; wherein the control circuit is configured to, according to a common voltage signal of the portion of the common electrode located in the distal region, generate a first compensation common voltage signal and transmit the first compensation common voltage signal to the first common signal line.

18. The display apparatus according to claim 17, wherein the array substrate further includes at least one feedback signal line disposed on the base; the at least one feedback signal line is coupled to the portion of the common electrode located in the distal region, and the at least one feedback signal line extends to the bonding region and is configured to be coupled to the circuit board; wherein a feedback signal line in the at least one feedback signal line is configured to transmit the common voltage signal of the portion of the common electrode located in the distal region to the circuit board.

19. The display apparatus according to claim 17, wherein the array substrate further includes at least one second common signal line and at least one third common signal line that are disposed on the base;

the at least one second common signal line is disposed in the third region and/or the fourth region, and the at least one second common signal line is coupled to a portion of the common electrode located in the proximal region;

the at least one third common signal line is disposed in the third region and/or the fourth region, and the at least one third common signal line is coupled to a portion of the common electrode located in a middle region between the distal region and the proximal region; and the control circuit is further configured to, according to the common voltage signal, generate a second compensation common voltage signal and transmit the second compensation common voltage signal to the second common signal line, and generate a third compensation common voltage signal and transmit the third compensation common voltage signal to the third common signal line.

* * * * *